US009809452B2

(12) United States Patent
Nikoobakht, IV

(10) Patent No.: US 9,809,452 B2
(45) Date of Patent: Nov. 7, 2017

(54) MAKING NANOCHANNELS AND NANOTUNNELS

(71) Applicant: THE UNITED STATES OF AMERICA, AS REPRESENTED BY THE SECRETARY OF COMMERCE, Washington, DC (US)

(72) Inventor: Babak Nikoobakht, IV, Potomac, MD (US)

(73) Assignee: The United States of America, as represented by the Secretary of Commerce, Washington, DC (US)

( * ) Notice: Subject to any disclaimer, the term of this patent is extended or adjusted under 35 U.S.C. 154(b) by 0 days.

(21) Appl. No.: 15/442,952

(22) Filed: Feb. 27, 2017

(65) Prior Publication Data

US 2017/0253479 A1    Sep. 7, 2017

Related U.S. Application Data

(60) Provisional application No. 62/303,130, filed on Mar. 3, 2016.

(51) Int. Cl.
| | |
|---|---|
| *B82B 3/00* | (2006.01) |
| *B82B 1/00* | (2006.01) |
| *H01L 21/306* | (2006.01) |
| *H01L 21/324* | (2006.01) |
| *H01L 21/02* | (2006.01) |
| *B01L 3/00* | (2006.01) |

(52) U.S. Cl.
CPC ...... *B82B 3/0019* (2013.01); *B01L 3/502707* (2013.01); *B82B 1/001* (2013.01); *H01L 21/02241* (2013.01); *H01L 21/30612* (2013.01); *H01L 21/3245* (2013.01); *B01L 2200/12* (2013.01); *B01L 2300/0896* (2013.01)

(58) Field of Classification Search
CPC . B82B 3/0019; B82B 1/001; B01L 3/502707; B01L 2300/0896; B01L 2200/12; H01L 21/3245; H01L 21/30612; H01L 21/02241
See application file for complete search history.

(56) References Cited

U.S. PATENT DOCUMENTS

2010/0029063 A1*    2/2010    Gambin ............... B82Y 10/00
                                                     438/478

* cited by examiner

*Primary Examiner* — Kyoung Lee
(74) *Attorney, Agent, or Firm* — Toby D. Hain

(57) ABSTRACT

A process for making a nanoduct includes: disposing an etchant catalyst on a semiconductor substrate including a single crystal structure; heating the semiconductor substrate to an etching temperature; introducing an oxidant; contacting the semiconductor substrate with the oxidant in a presence of the etchant catalyst; anisotropically etching the semiconductor substrate by the etchant catalyst in a presence of the oxidant in an etch direction that is coincident along a crystallographic axis of the semiconductor substrate; and forming the nanoduct as the etchant catalyst propagates along a surface of the semiconductor substrate during anisotropically etching the semiconductor substrate, the nanoduct being crystallographically aligned with the crystallographic axis of the semiconductor substrate.

20 Claims, 35 Drawing Sheets

(A) 100

(B) 100

(A) 100

(B) 100

(A) 100

(B) 100 Crystallographic direction
Anisotropic etch direction (A)

(B)

(C)

(D)

(E)

(A)

(B)

MAKING NANOCHANNELS AND NANOTUNNELS

CROSS REFERENCE TO RELATED APPLICATIONS

This application claims the benefit of U.S. Provisional Patent Application Ser. Nos. 62/303,130, filed Mar. 3, 2016, the disclosure of which is incorporated herein by reference in its entirety.

STATEMENT REGARDING FEDERALLY SPONSORED RESEARCH

This invention was made with United States Government support from the National Institute of Standards and Technology. The Government has certain rights in the invention.

BRIEF DESCRIPTION

Disclosed is a process for making a nanoduct, the process comprising: disposing an etchant catalyst on a semiconductor substrate comprising a single crystal structure; heating the semiconductor substrate to an etching temperature; introducing an oxidant; contacting the semiconductor substrate with the oxidant in a presence of the etchant catalyst; anisotropically etching the semiconductor substrate by the etchant catalyst in a presence of the oxidant in an etch direction that is coincident along a crystallographic axis of the semiconductor substrate; and forming the nanoduct as the etchant catalyst propagates along a surface of the semiconductor substrate during anisotropically etching the semiconductor substrate, the nanoduct being crystallographically aligned with the crystallographic axis of the semiconductor substrate.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments is presented herein by way of exemplification and not limitation.

It has been discovered that a process for making a nanoduct herein provides metal-assisted semiconductor etching to form a nanochannel or nanotunnel. Unexpectedly and advantageously, an etchant catalyst, e.g., Au, that has a certain size alloys with atoms in a semiconductor substrate and, in a presence of an oxidant, locally catalyzes oxidation of semiconductor substrate to anisotropically etch the semiconductor substrate along a crystallographic direction of the semiconductor substrate. The anisotropic etching is site specific and controls a direction of the nanochannel and nanotunnel. The process can be used to develop advanced materials, a multifunctional heterogeneous nanosystem, electro-optical devices, nanofluidic articles, and the like.

Figure 1:
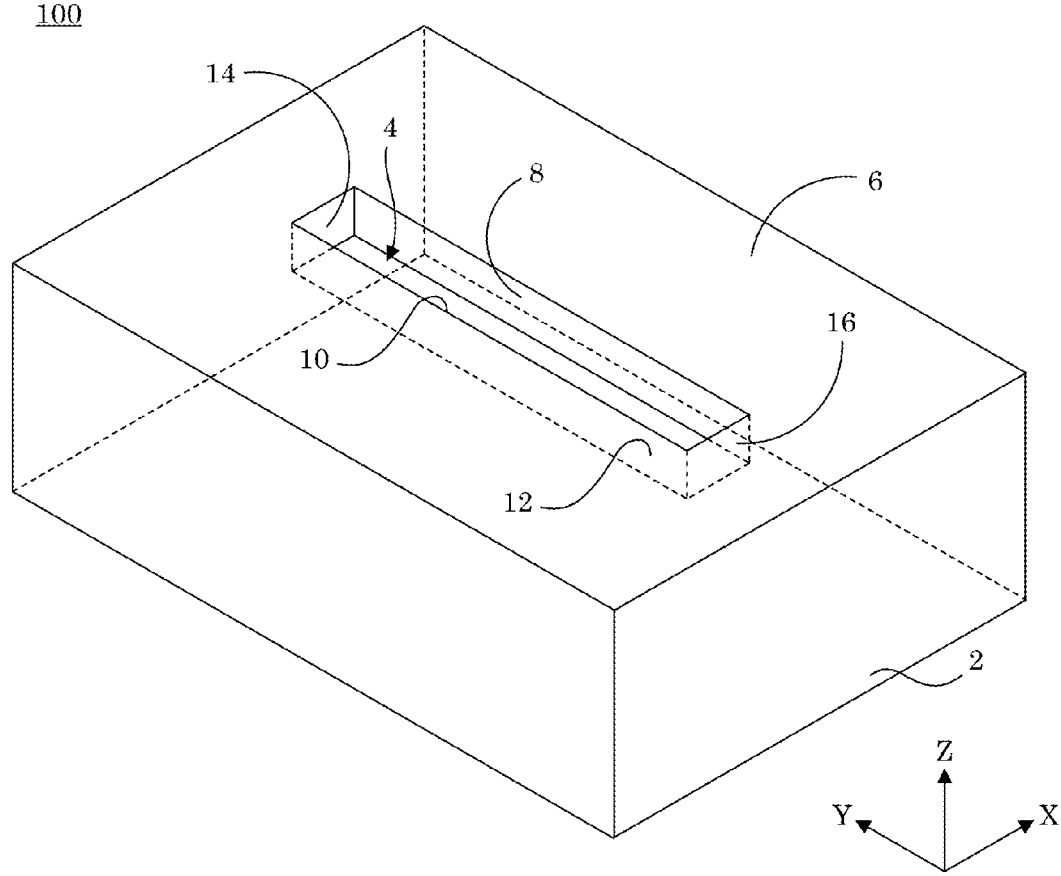
FIG. 1 shows a nanoduct that includes a nanochannel disposed on a semiconductor substrate in which panel A shows a perspective view, and panel B shows a top view.
Figure 1:
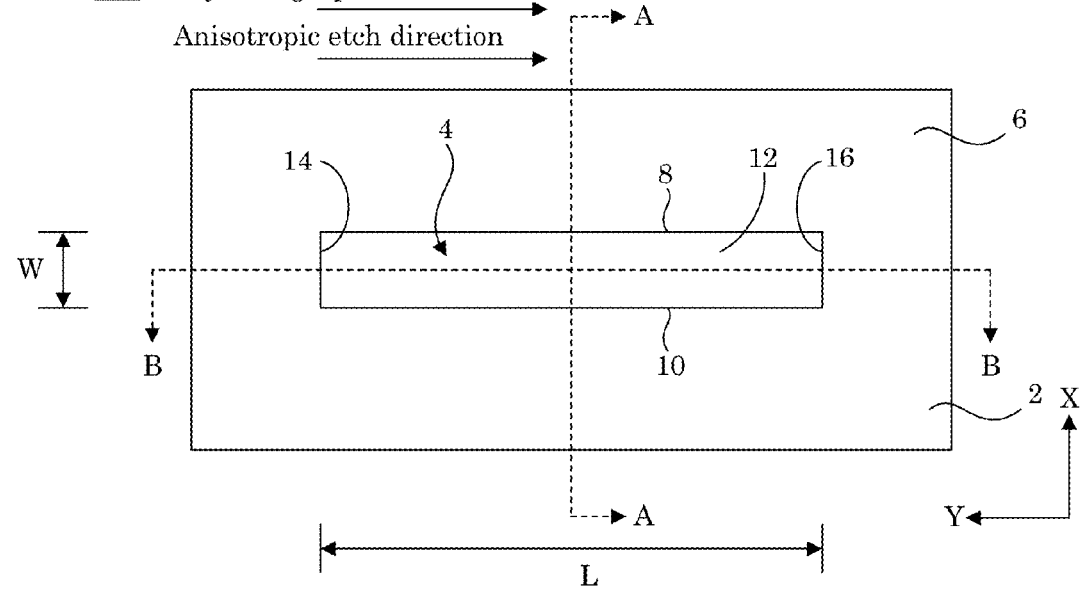
Figure 2:
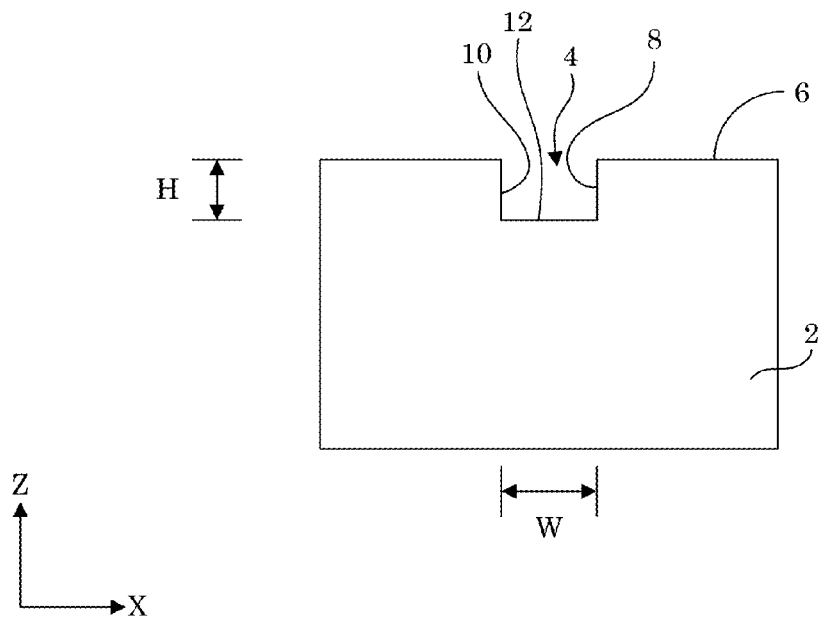
FIG. 2 shows a cross-section along line A-A of the nanoduct shown in FIG. 1, and panel B shows a cross-section along line B-B of the nanoduct shown in FIG. 1.
Figure 2:
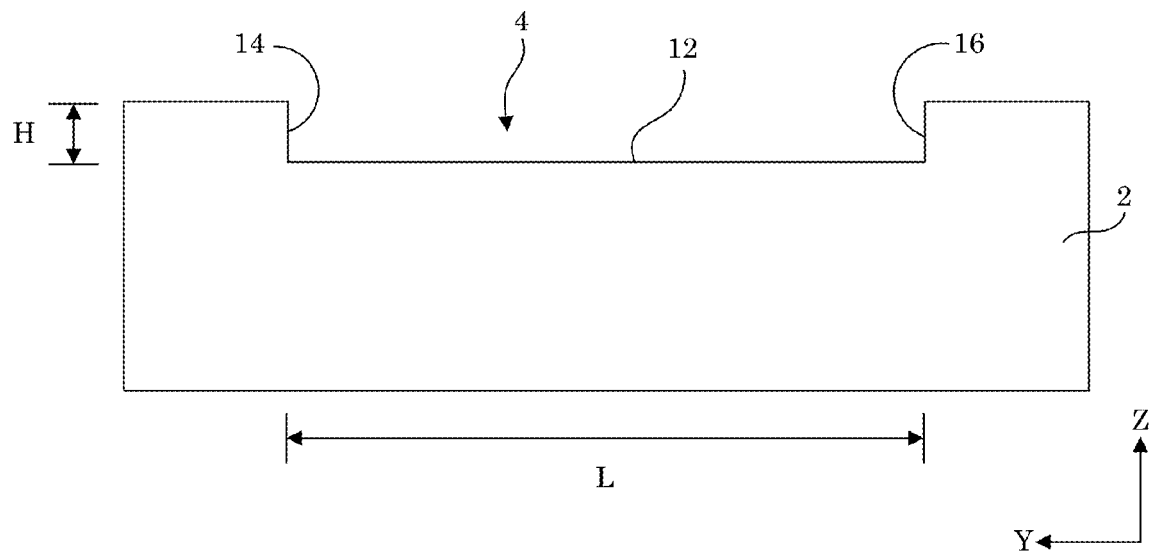

In an embodiment, with reference to FIG. 1 (panel A: perspective view; panel B: top view) and FIG. 2 (cross-sectional views), nanoduct article 100 includes nanoduct 4 disposed on semiconductor substrate 2. Here, nanoduct 4 is a nanochannel bounded by sidewalls (8, 10), duct wall 12, aft wall 14, and fore wall 16. A crystallographic direction of semiconductor substrate 2 at surface 6 is indicated by an arrow in the figures. Nanoduct 4 is formed by anisotropically etching a portion of semiconductor substrate 2 at surface 6 in an anisotropic etch direction coincident along the crystallographic direction of semiconductor substrate 2 such that aft wall 14 is initially formed followed by etching of semiconductor substrate 2 to form fore wall 16 opposing aft wall 14.

Nanochannel 4 includes length L, width W, and height H. Length L is a distance from aft wall 14 to fore wall 16. Width W is a distance from sidewall 8 to sidewall 10. Height H is a distance from duct wall 12 to surface 6.

Figure 3:
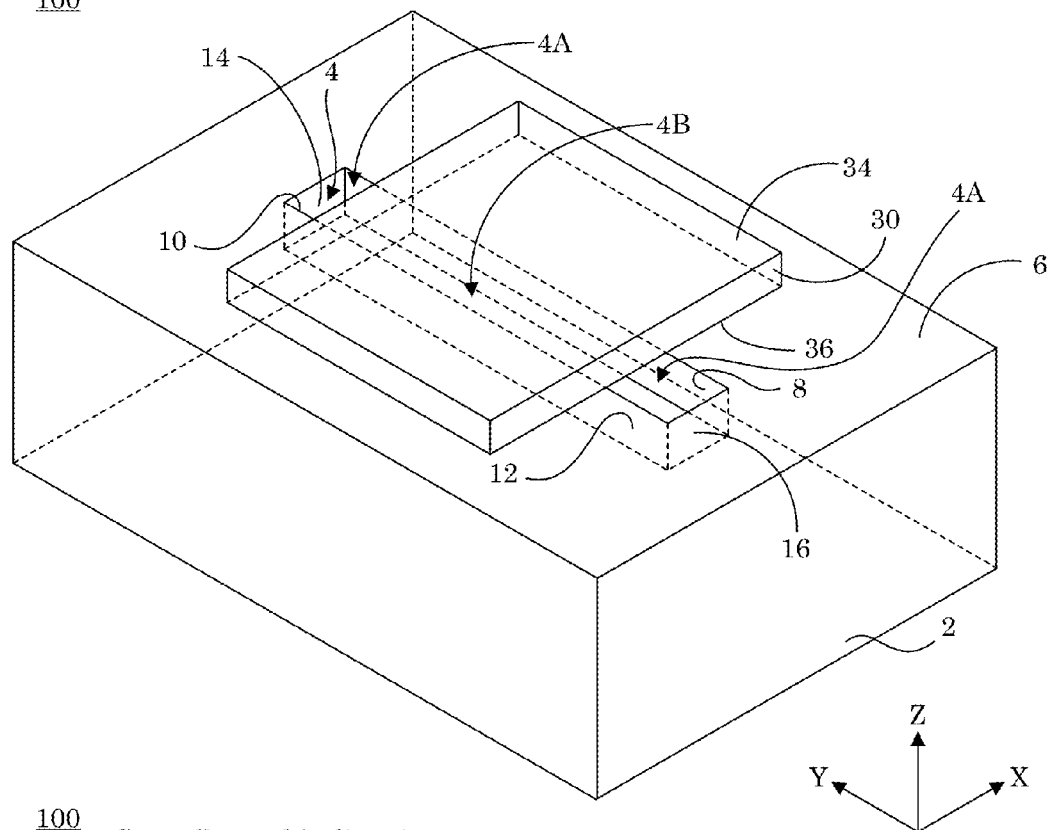
FIG. 3 shows a nanoduct that includes a nanochannel and a nanotunnel disposed on a semiconductor substrate in which panel A shows a perspective view, and panel B shows a top view.
Figure 3:
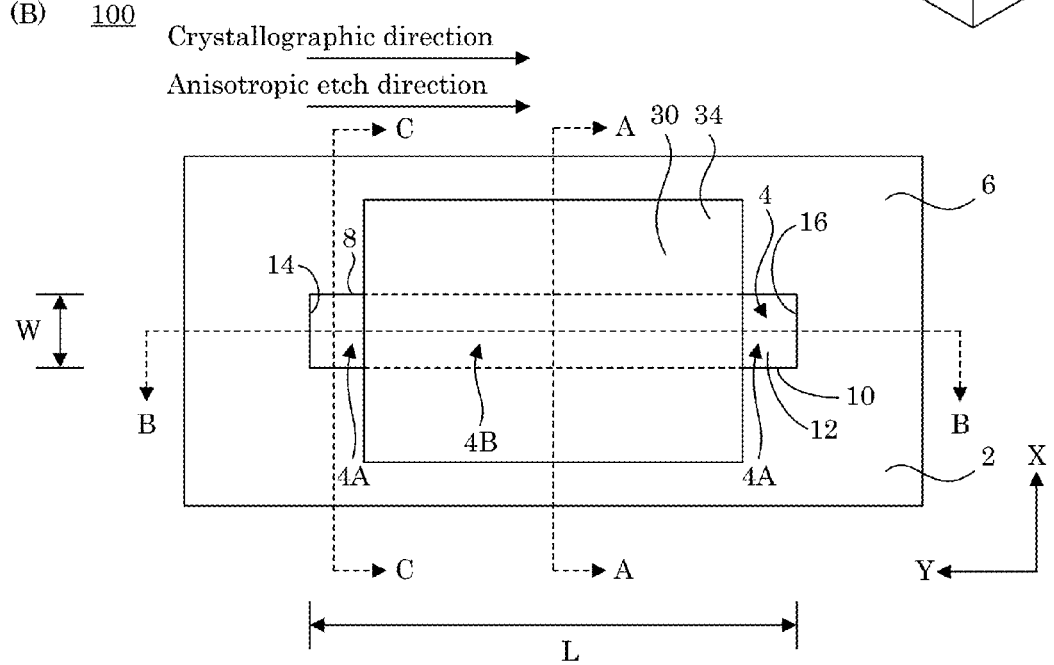
Figure 4:
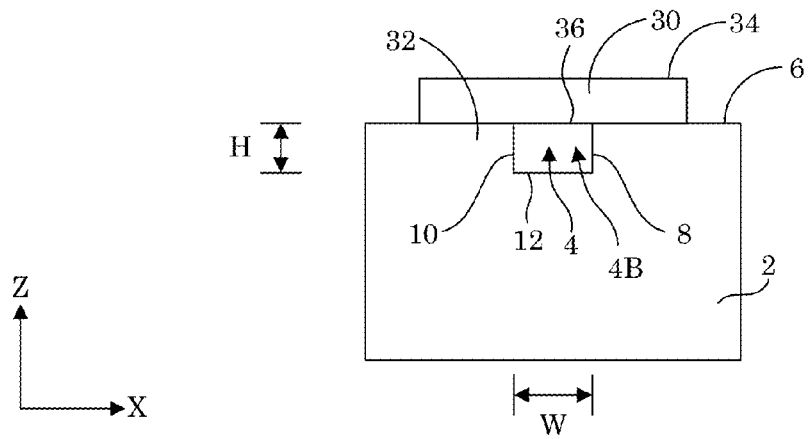
FIG. 4 shows a cross-section along line A-A of the nanoduct shown in FIG. 3; panel B shows a cross-section along line B-B of the nanoduct shown in FIG. 3, and panel C shows a cross-section along line C-C of the nanoduct shown in FIG. 3.
Figure 4:
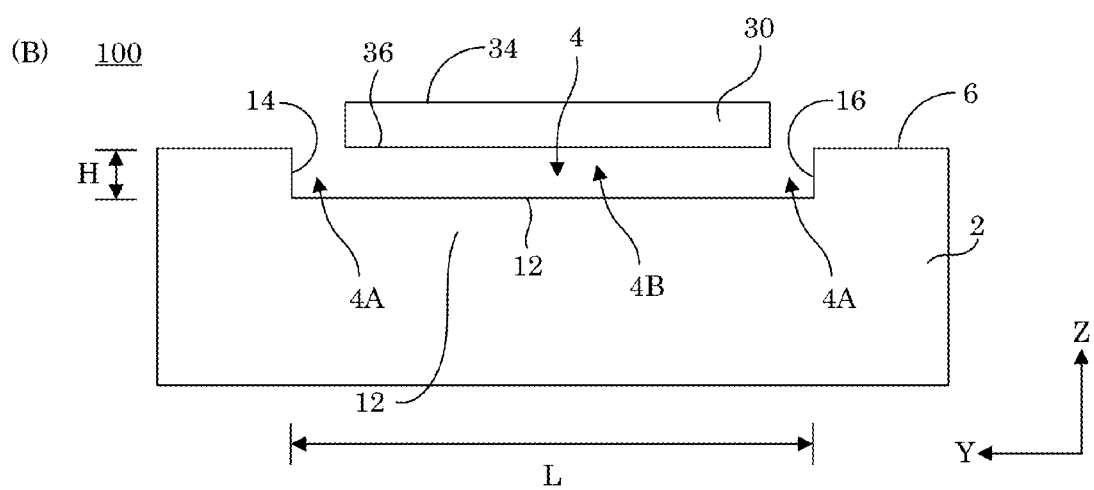
Figure 4:
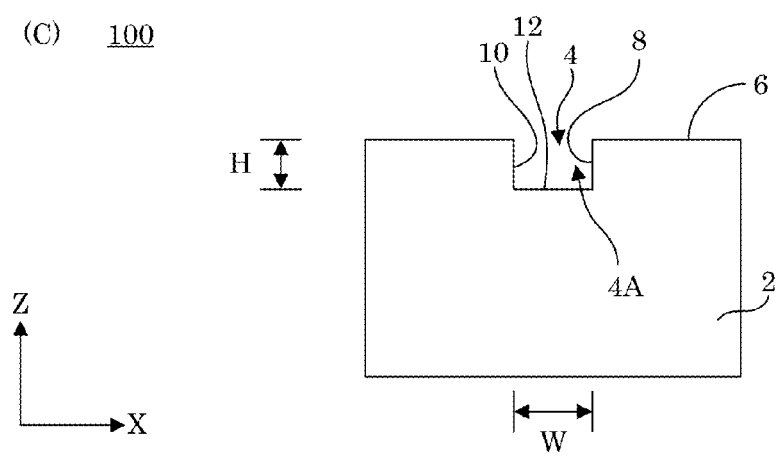
Figure 5:
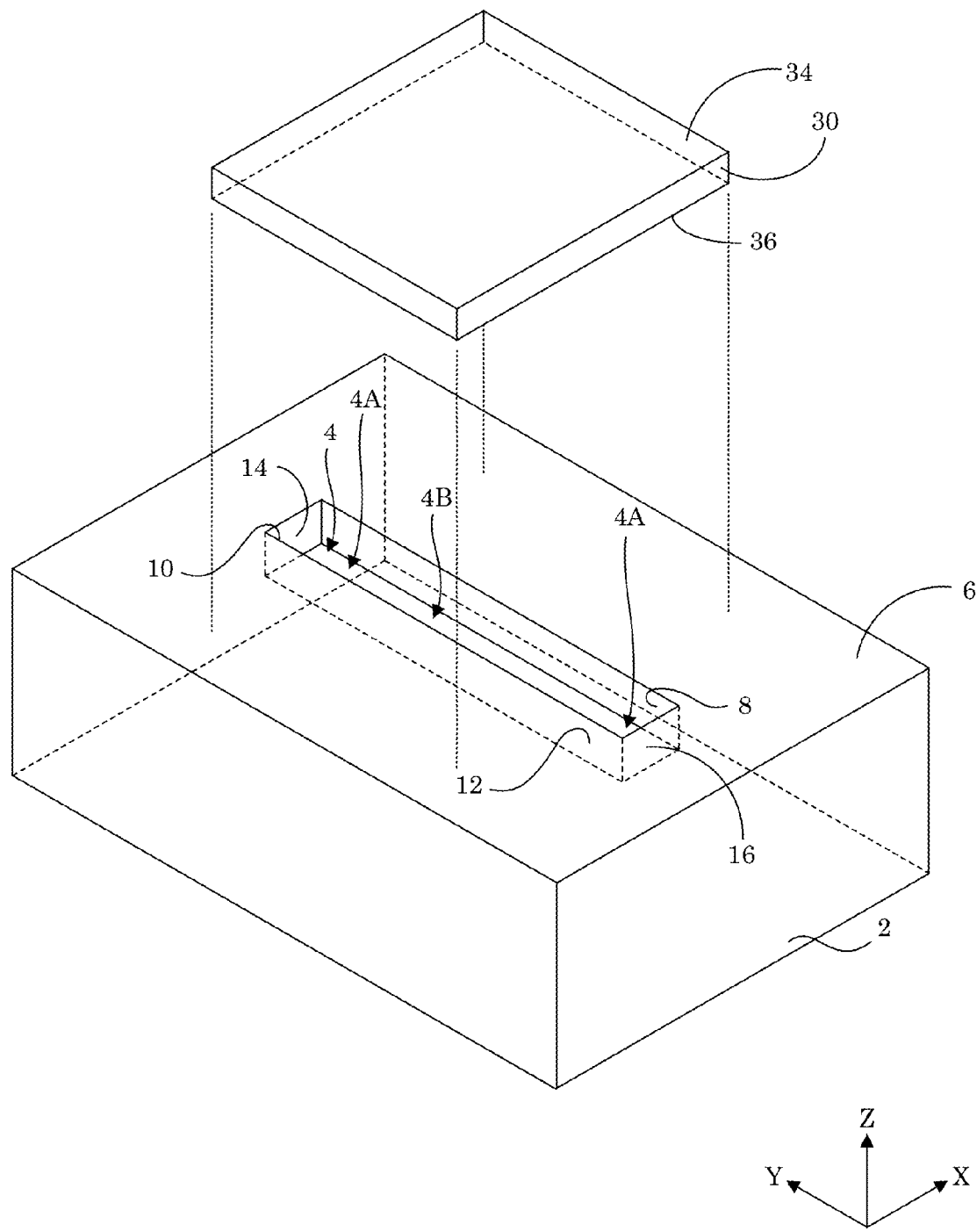
FIG. 5 shows an exploded view of the nanoduct shown in FIG. 3.

In an embodiment, with reference to FIG. 3 (panel A: perspective view; panel B: top view), FIG. 4 (cross-sectional views), and FIG. 5 (exploded view), nanoduct article 100 includes nanoduct 4 disposed on semiconductor substrate 2 and covering layer 30 disposed on surface 6 of semiconductor substrate 2. Here, nanoduct 4 includes nanotunnel 4B interposed between nanochannels 4A. Nanochannel 4A is bounded by sidewalls (8, 10), duct wall 12, aft wall 14, and fore wall 16. Nanotunnel 4B is bounded by sidewalls (8, 10), duct wall 12, and duct surface 36 of covering layer 30. Covering layer 30 includes outer surface 34 and duct surface 36 that opposes surface 6 of semiconductor substrate 2 and duct wall 12. Covered portion 32 is a portion of semiconductor substrate 2 on which covering layer 30 is disposed and that is covered by covering layer 30 such that covered portion 32 is not directly exposed to an environment external to semiconductor substrate 2. Further, during anisotropic etching of semiconductor substrate 2, the etchant catalyst anisotropically etches semiconductor substrate 2, wherein the etchant catalyst propagates along the crystallographic direction in the anisotropic etch direction to form nanotunnel 4B. It is contemplated that covering layer 30 can be permeable to the oxidant so that oxidant can traverse across covering layer 30 from outer surface 34 to duct surface 36 and contact semiconductor substrate 2 covered by covering layer 30.

Figure 6:
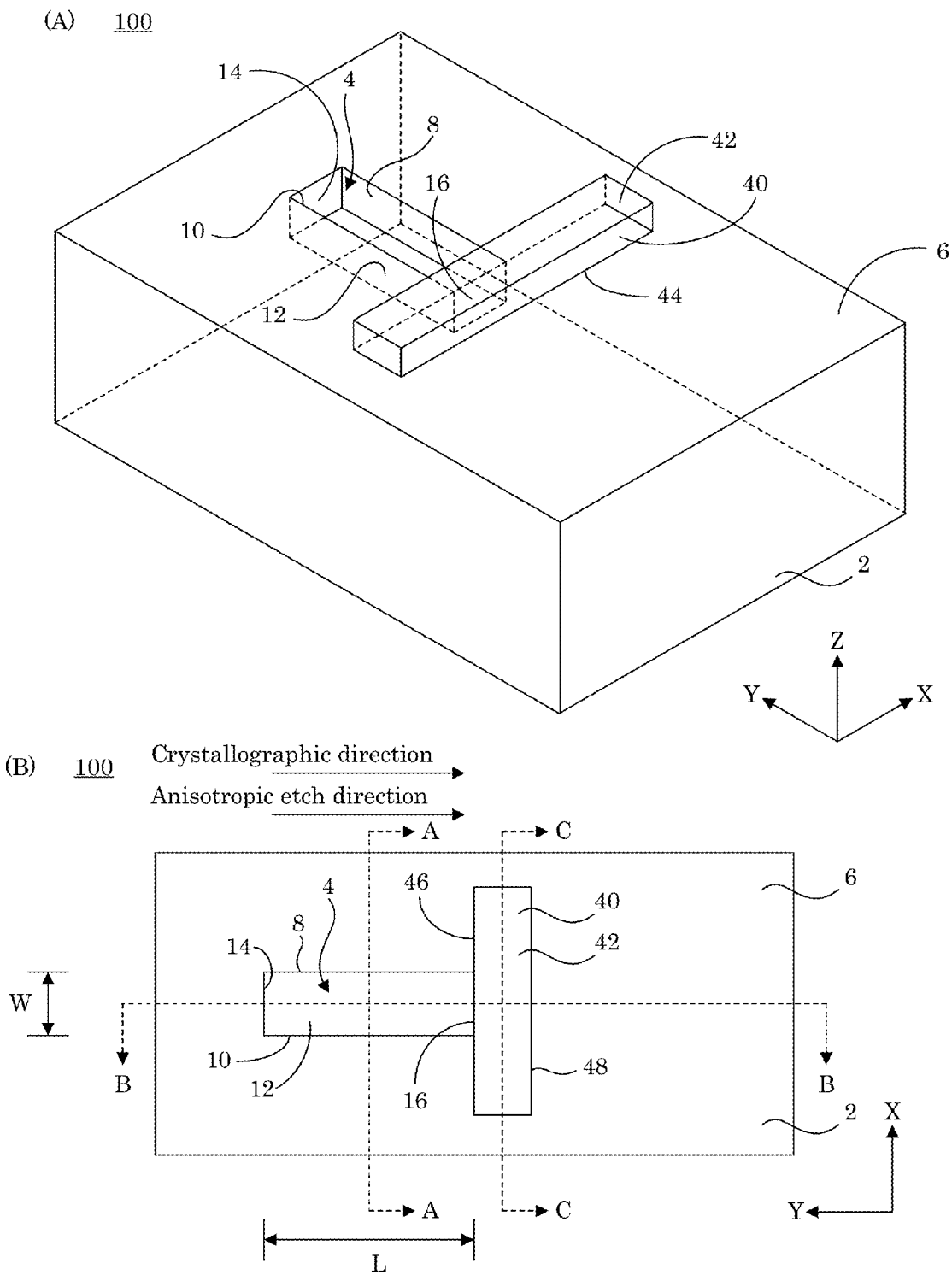
FIG. 6 shows a nanoduct that includes a nanochannel that terminates at a blocking layer disposed on a semiconductor substrate in which panel A shows a perspective view, and panel B shows a top view.
Figure 7:
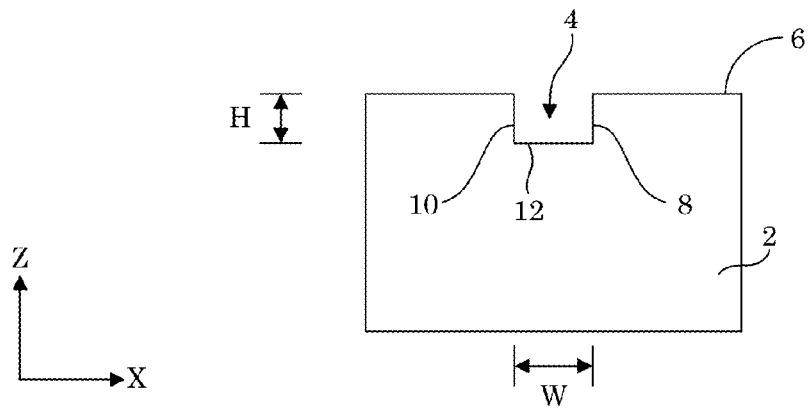
FIG. 7 shows a cross-section along line A-A of the nanoduct shown in FIG. 6; panel B shows a cross-section along line B-B of the nanoduct and the blocking layer shown in FIG. 6, and panel C shows a cross-section along line C-C of the blocking layer shown in FIG. 6.
Figure 7:
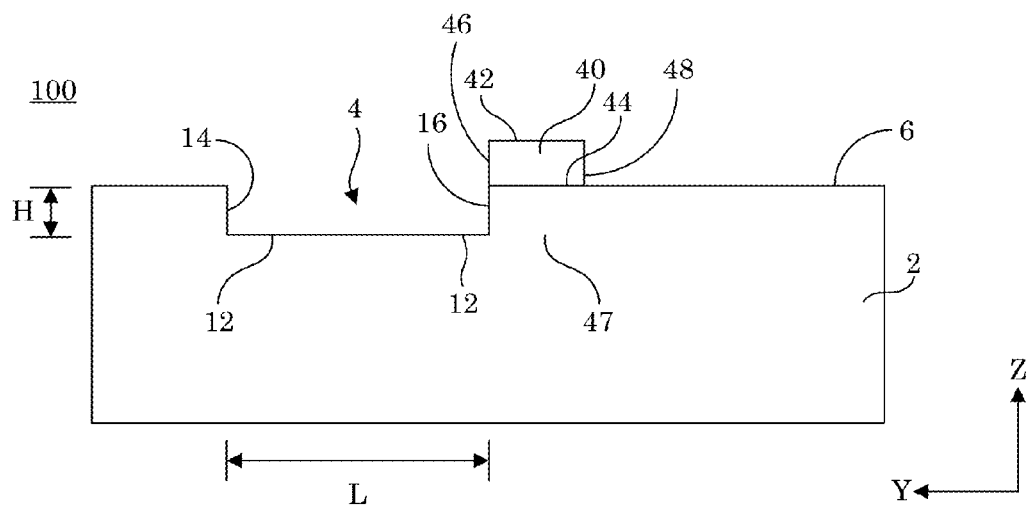
Figure 7:
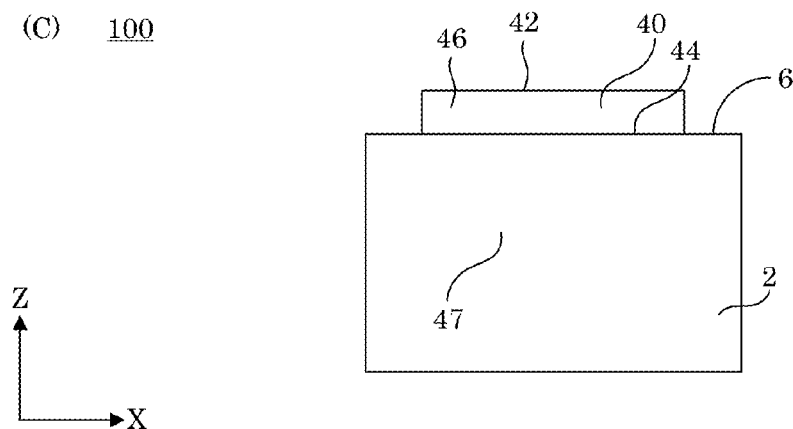
Figure 8:
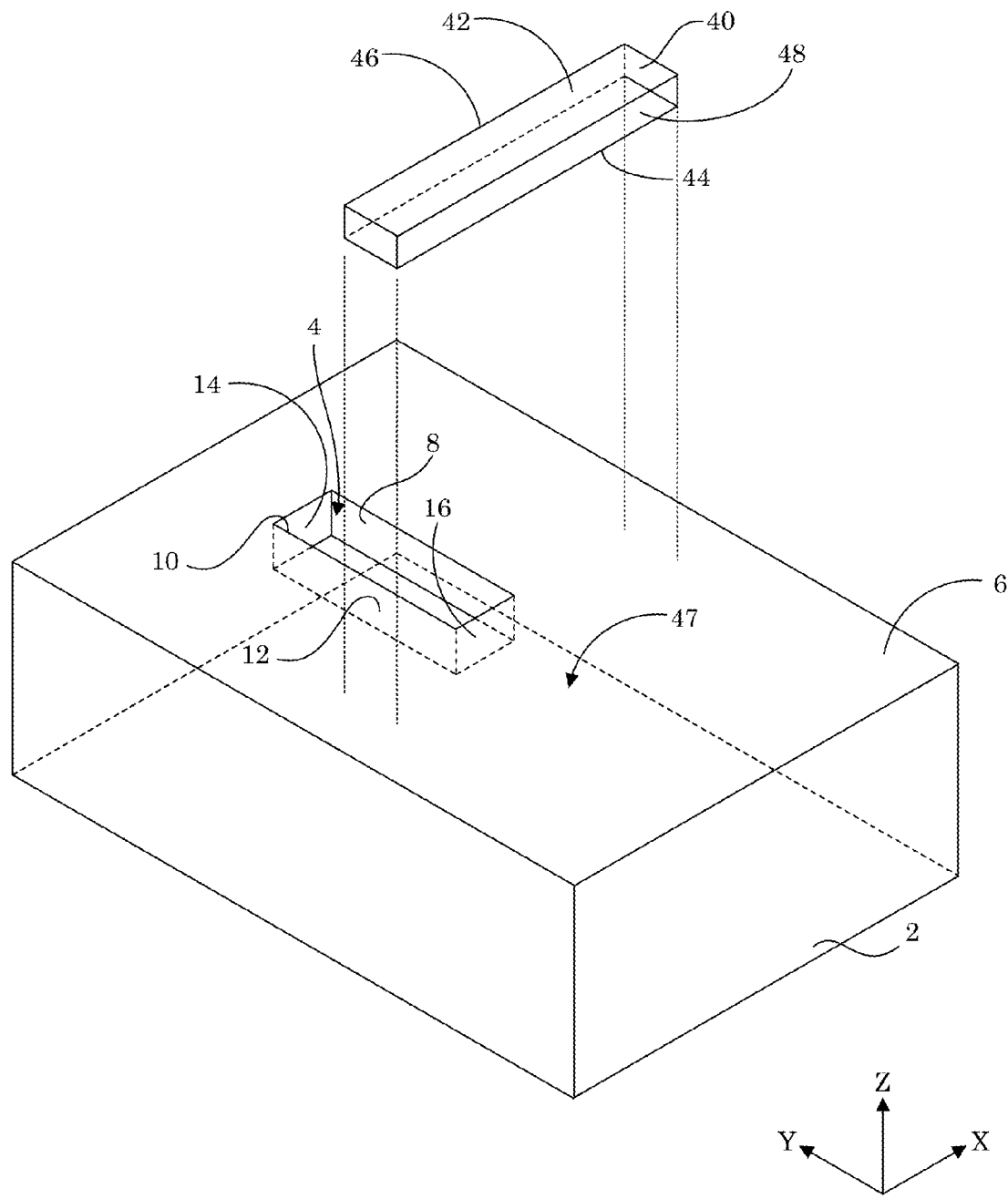
FIG. 8 shows an exploded view of the nanoduct and the blocking layer shown in FIG. 6.

In an embodiment, with reference to FIG. 6 (panel A: perspective view; panel B: top view), FIG. 7 (cross-sectional views), and FIG. 8 (exploded view), nanoduct article 100 includes nanoduct 4 disposed on semiconductor substrate 2 and blocking layer 40 disposed on surface 6 of semiconductor substrate 2. Here, nanoduct 4 includes the nanochannel that is bounded by sidewalls (8, 10), duct wall 12, aft wall 14, and fore wall 16. Blocking layer 40 includes outer surface 42 and interface surface 44 that opposes surface 6 of semiconductor substrate 2. Blocked portion 47 is a portion of semiconductor substrate 2 on which blocking layer 40 is disposed and that is covered by blocking layer 40 such that blocked portion 47 is not directly exposed to an environment external to semiconductor substrate 2. Further, during anisotropic etching of semiconductor substrate 2, the etchant catalyst anisotropically etches semiconductor substrate 2, wherein the etchant catalyst propagates along the crystallographic direction in the anisotropic etch direction to form nanoduct 4 (here, the nanochannel). Etching terminates at blocking layer 40 such that blocked portion 47 is not etch, and fore wall 16 is adjacent to termination surface 46 of blocking layer 40. It is contemplated that blocking layer 40 can be impermeable to the oxidant so that oxidant is not communicated across blocking layer 40 from outer surface 42 to interface surface 44 such that the oxidant is absent at interface surface 44 that blocked portion 47 of semiconductor substrate 2.

Figure 9:
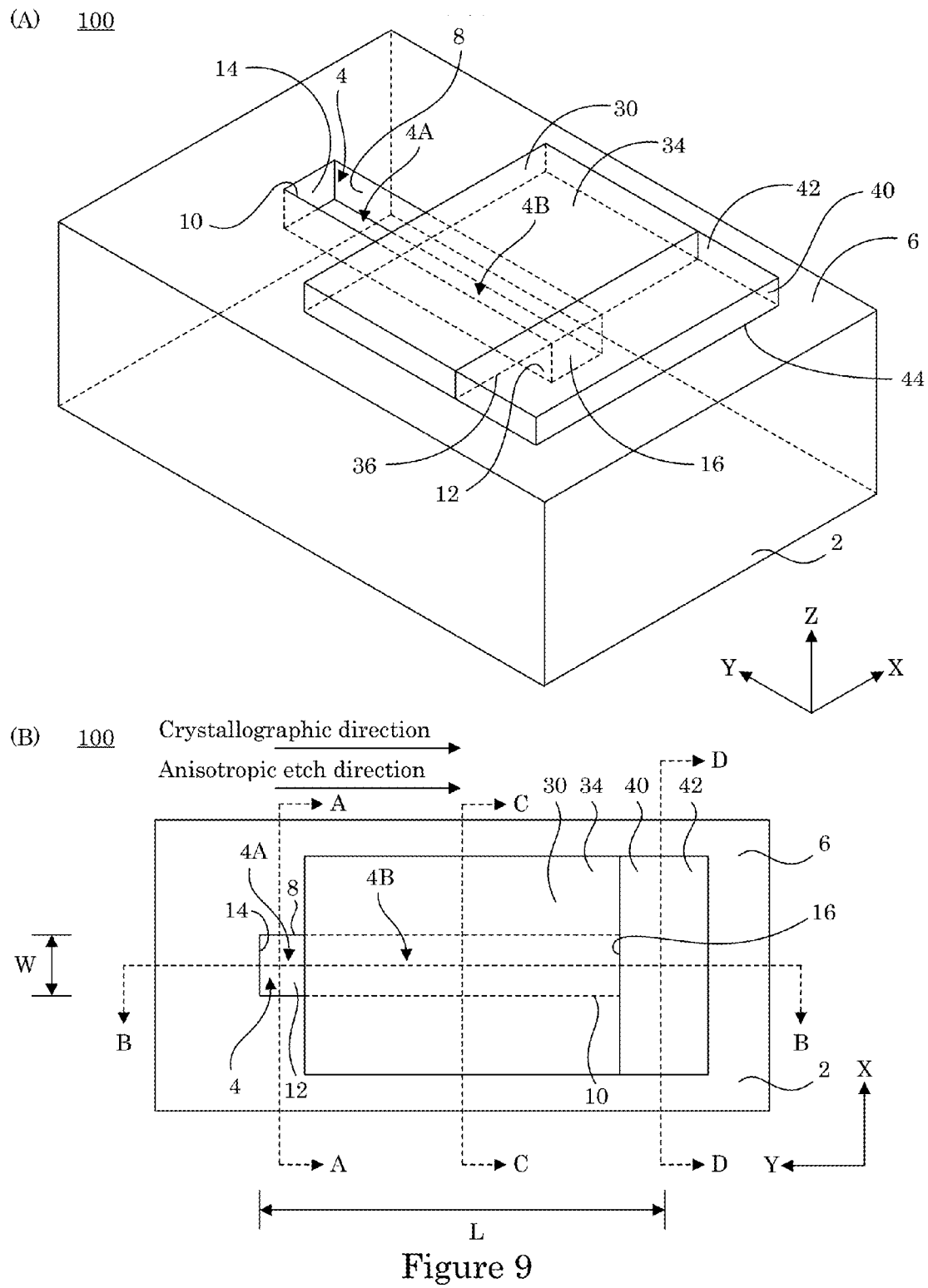
FIG. 9 shows a nanoduct that includes a nanochannel and a nanotunnel that terminates at a blocking layer disposed on a semiconductor substrate in which panel A shows a perspective view, and panel B shows a top view.
Figure 10:
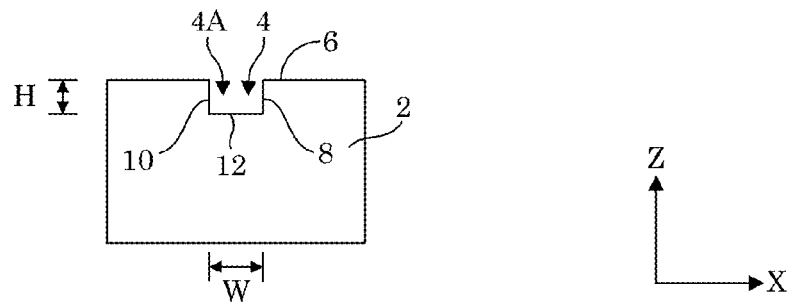
FIG. 10 shows a cross-section along line A-A of the nanoduct shown in FIG. 9; panel B shows a cross-section along line B-B of the nanoduct and the blocking layer shown in FIG. 9; panel C shows a cross-section along line C-C of the nanotunnel, and panel D shows a cross-section along line D-D of the blocking layer shown in FIG. 9.
Figure 10:
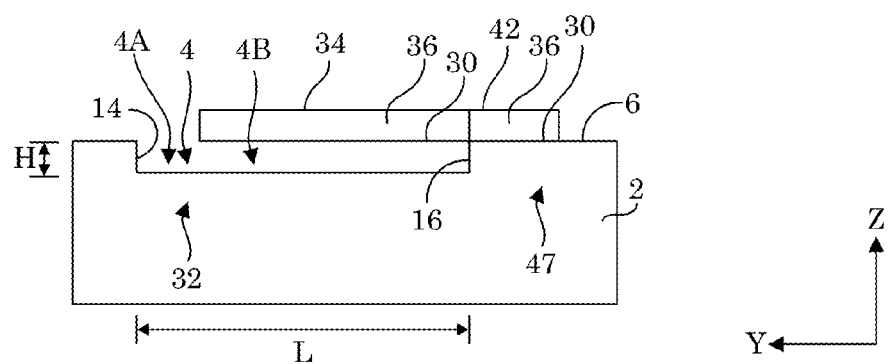
Figure 10:
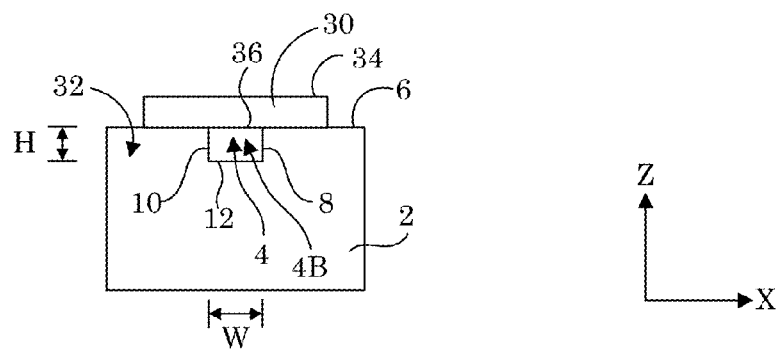
Figure 10:
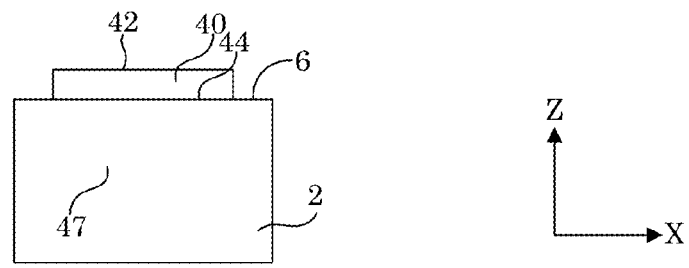
Figure 11:
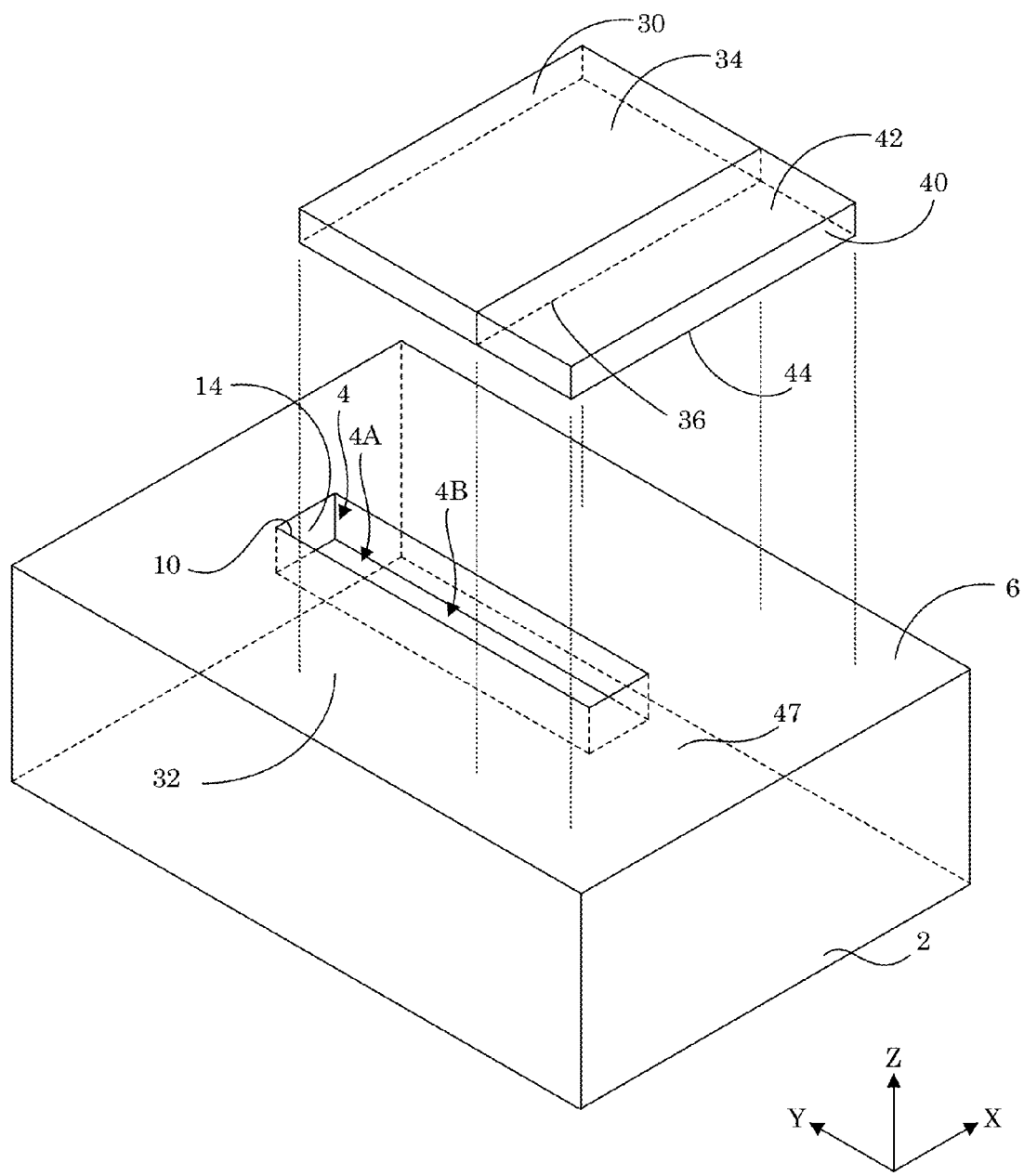
FIG. 11 shows an exploded view of the nanoduct and the blocking layer shown in FIG. 9.

In an embodiment, with reference to FIG. 9 (panel A: perspective view; panel B: top view), FIG. 10 (cross-sectional views), and FIG. 11 (exploded view), nanoduct article 100 includes nanoduct 4 disposed on semiconductor substrate 2, covering layer 30 disposed on surface 6 of semiconductor substrate 2, and the blocking layer 40 disposed on surface 6 of semiconductor substrate 2. Here, nanoduct 4 includes nanochannels 4A and nanotunnel 4B interposed between nanochannel 4A and blocking portion 46. Nanochannel 4A is bounded by sidewalls (8, 10), duct wall 12, and aft wall 14. Nanotunnel 4B is bounded by sidewalls (8, 10), duct wall 12, duct surface 36 of covering layer 30, and fore wall 16 proximate to blocking layer 40 and blocking portion 46 of semiconductor substrate 2. Covering layer 30 is directly adjacently disposed to blocking layer 40 on surface 6 of semiconductor substrate 2 such that covered portion 32 is directly adjacent to blocked portion 47.

Figure 12:
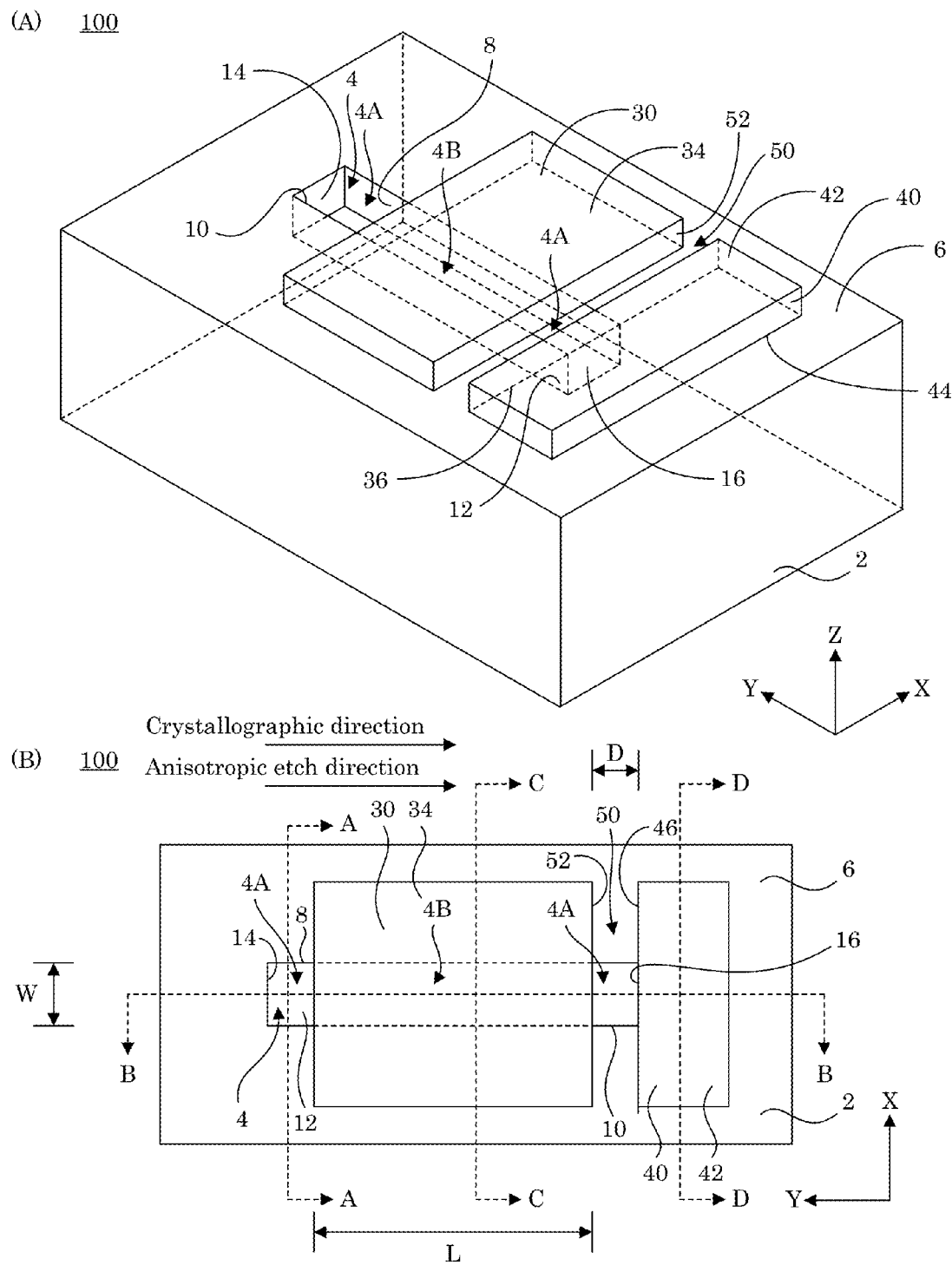
FIG. 12 shows a nanoduct that includes a nanotunnel and nanochannel that terminates at a blocking layer disposed on a semiconductor substrate in which panel A shows a perspective view, and panel B shows a top view.
Figure 13:
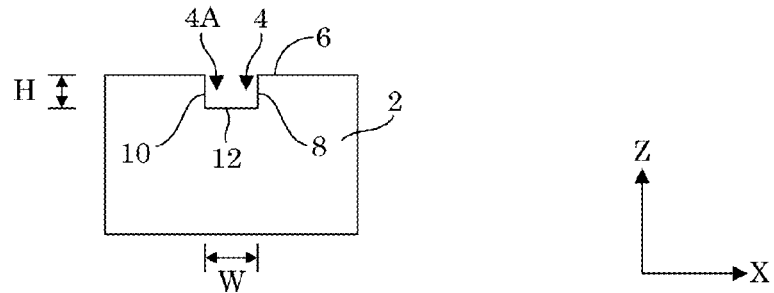
FIG. 13 shows a cross-section along line A-A of the nanoduct shown in FIG. 12; panel B shows a cross-section along line B-B of the nanoduct and the blocking layer shown in FIG. 9; panel C shows a cross-section along line C-C of the nanotunnel, and panel D shows a cross-section along line D-D of the blocking layer shown in FIG. 9.
Figure 13:
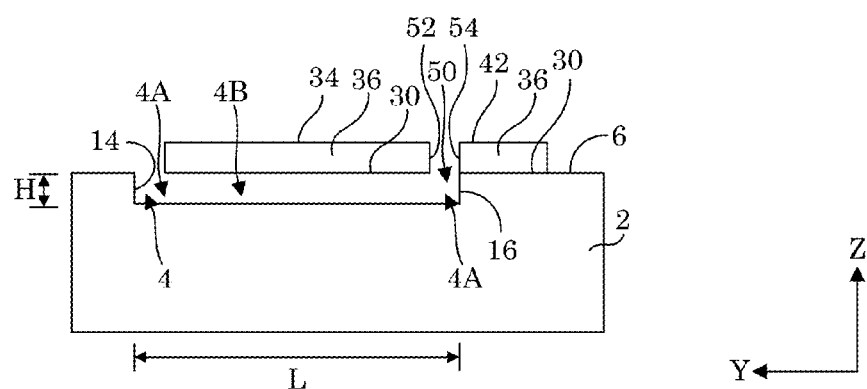
Figure 13:
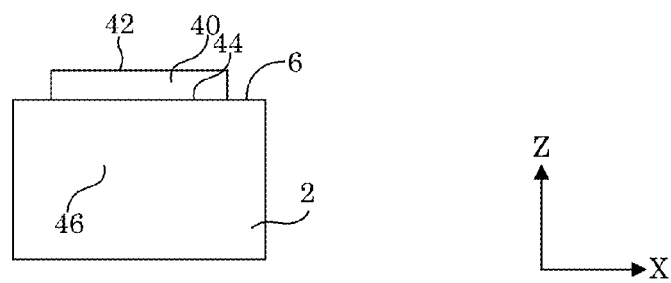
Figure 13:
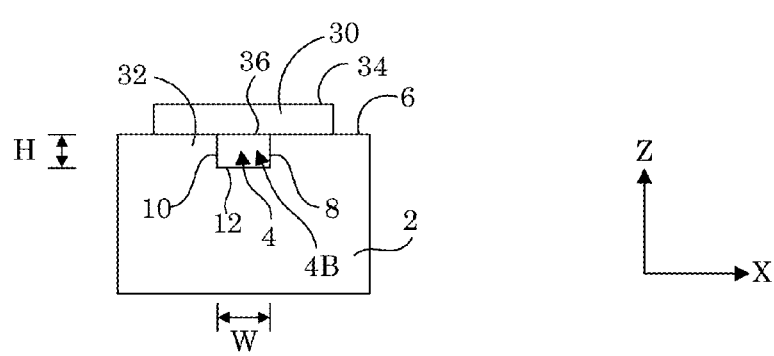
Figure 14:
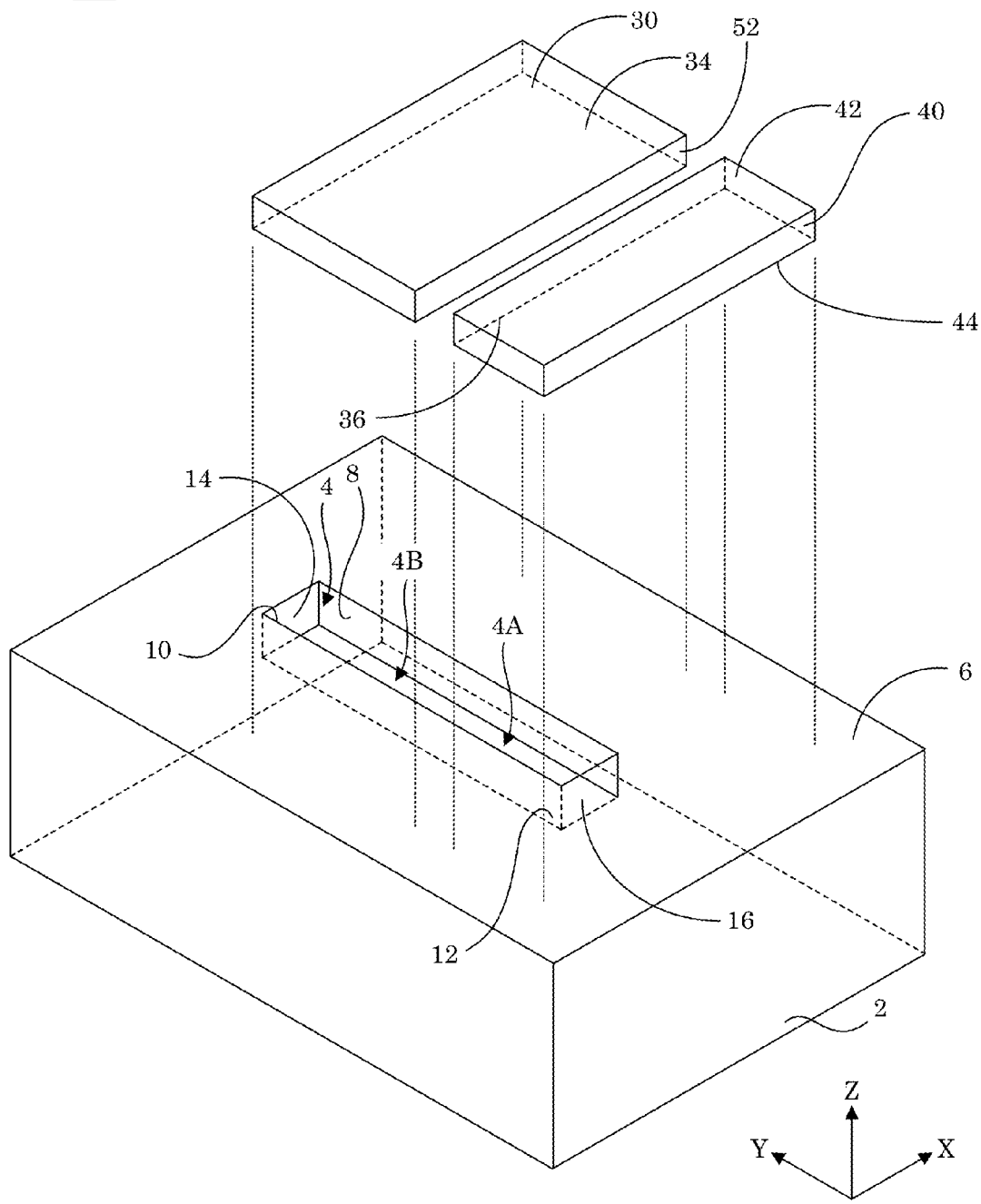
FIG. 14 shows an exploded view of the nanoduct and the blocking layer shown in FIG. 9.

In an embodiment, with reference to FIG. 12 (panel A: perspective view; panel B: top view), FIG. 13 (cross-sectional views), and FIG. 14 (exploded view), nanoduct article 100 includes nanoduct 4 disposed on semiconductor substrate 2, covering layer 30 disposed on surface 6 of semiconductor substrate 2, and the blocking layer 40 disposed on surface 6 of semiconductor substrate 2, wherein edge 52 of covering layer 30 and termination surface 46 of blocking layer 40 are spaced apart by a gap 50 over distance D. Here, nanoduct 4 includes nanochannels 4A and nanotunnel 4B interposed between nanochannels 4A. Nanochannel 4A is bounded by sidewalls (8, 10), duct wall 12, aft wall 14, and fore wall 16. Nanotunnel 4B is bounded by sidewalls (8, 10), duct wall 12, and duct surface 36 of covering layer 30. Fore wall 16 is proximate to blocking layer 40 and blocking portion 46 of semiconductor substrate 2. In this manner, blocking layer 40 terminates anisotropic etching of substrate 2 such that length L of nanoduct 4 is selectively controlled by presence of blocking layer 40 a distance length L from aft wall 14.

In an embodiment, width W of nanoduct 4 is substantially the same across length L of nanoduct 4, e.g., as shown in FIG. 1. According to an embodiment, with reference to FIG. 15, FIG. 16, FIG. 17, FIG. 18, and FIG. 19, width W of nanoduct 4 varies across length L of nanoduct 4. Here, nanoduct 4 can be the nanotunnel in which the nanotunnel is a nanofrustocone. In certain embodiments, nanoduct 4 is the nanochannel in which the nanochannel is a truncated nanofrustocone. As used herein, "nanochannel" refers to a structure in which the nanochannel is not covered along length L during formation of the nanochannel by anisotropic etching of semiconductor substrate 2 by the etchant catalyst. As used herein, "nanotunnel" refers to a structure in which the nanotunnel is covered along length L during formation of the nanotunnel by anisotropic etching of semiconductor substrate 2 by the etchant catalyst. As used herein, "nanofrustocone" refers to a structure in which sidewalls (8, 10) converge or diverge along length L in a direction of the crystallographic direction of semiconductor substrate 2 in the anisotropic etch direction as well as being covered along length L. As used herein, "truncated nanofrustocone" refers to a structure in which sidewalls (8, 10) converge or diverge along length L in a direction of the crystallographic direction of semiconductor substrate 2 in the anisotropic etch direction as well as being uncovered and exposed along length L.

Figure 15:
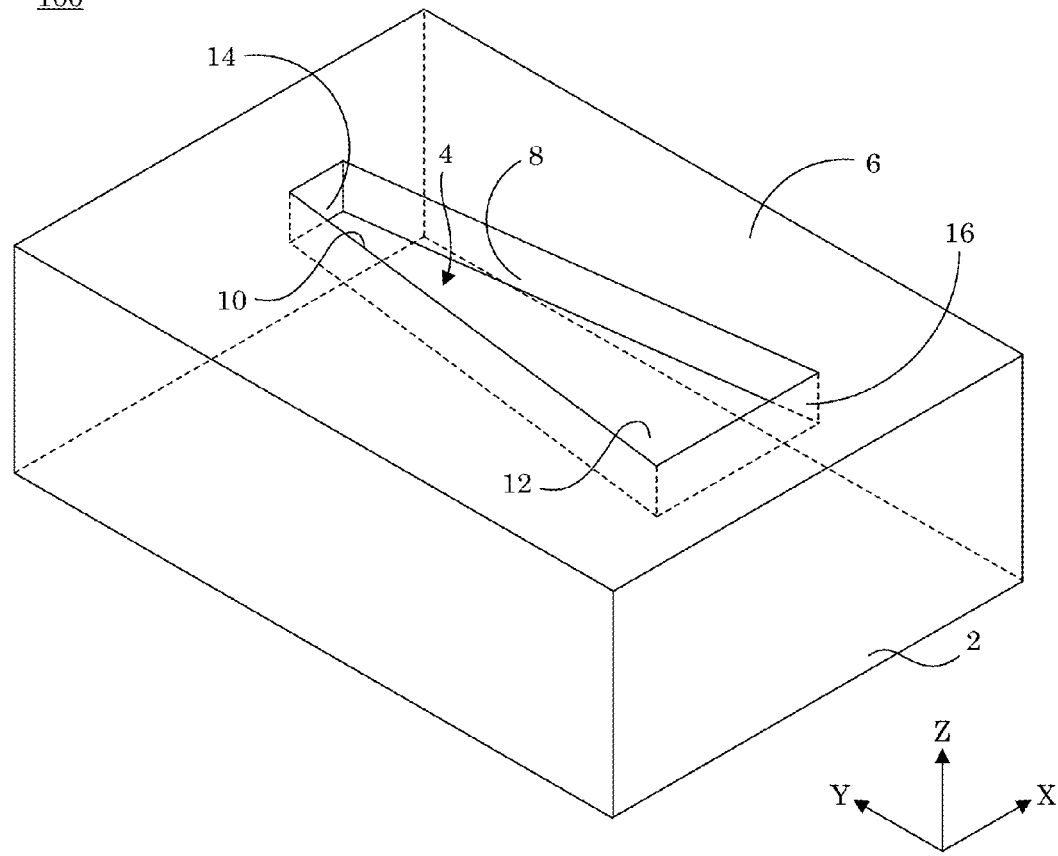
FIG. 15 shows a nanoduct that includes a divergent truncated frustonical nanochannel disposed on a semiconductor substrate in which panel A shows a perspective view, and panel B shows a top view.
Figure 15:
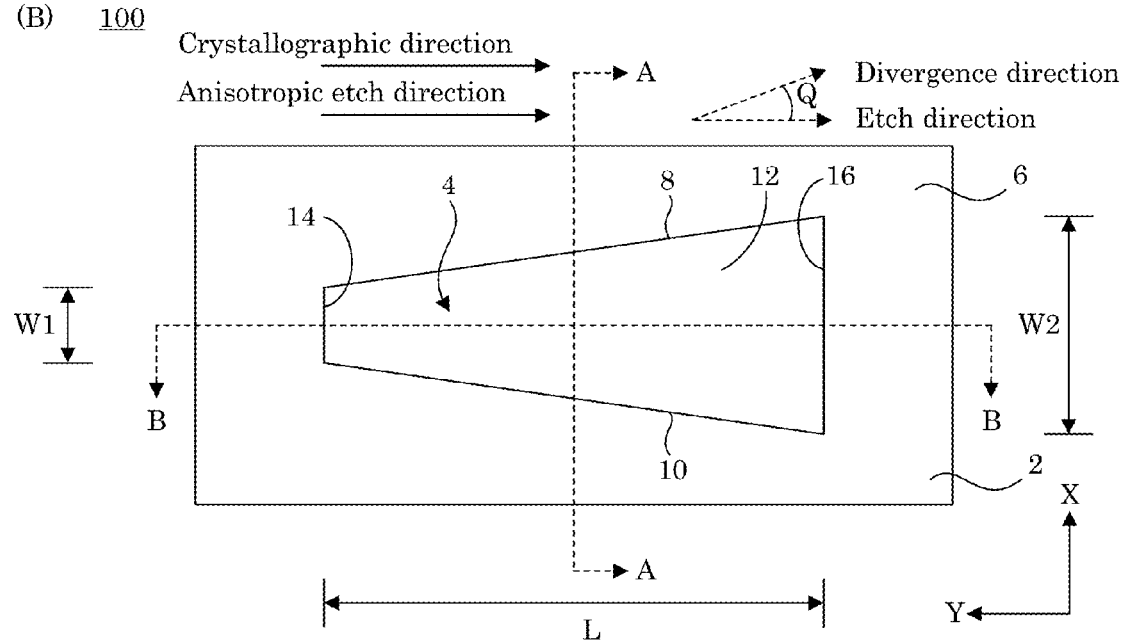
Figure 16:
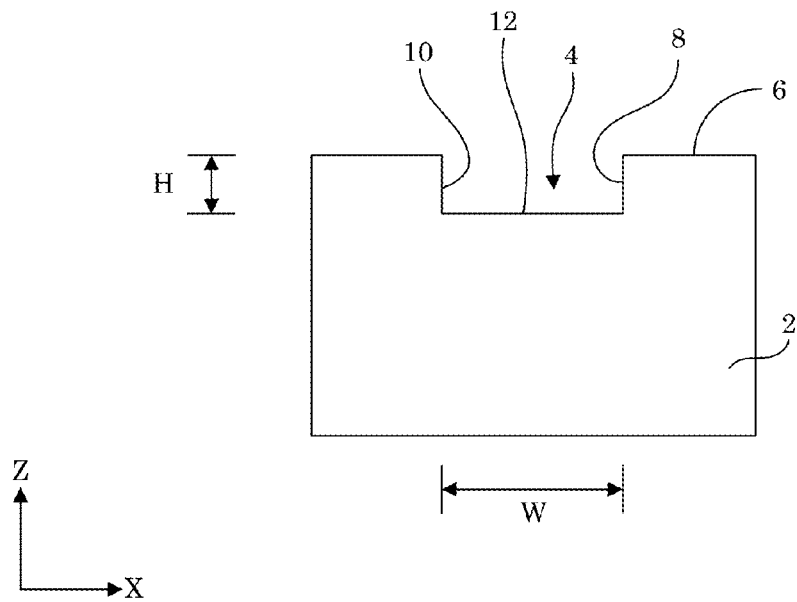
FIG. 16 shows a cross-section along line A-A of the nanoduct shown in FIG. 15, and panel B shows a cross-section along line B-B of the nanoduct shown in FIG. 15.
Figure 16:
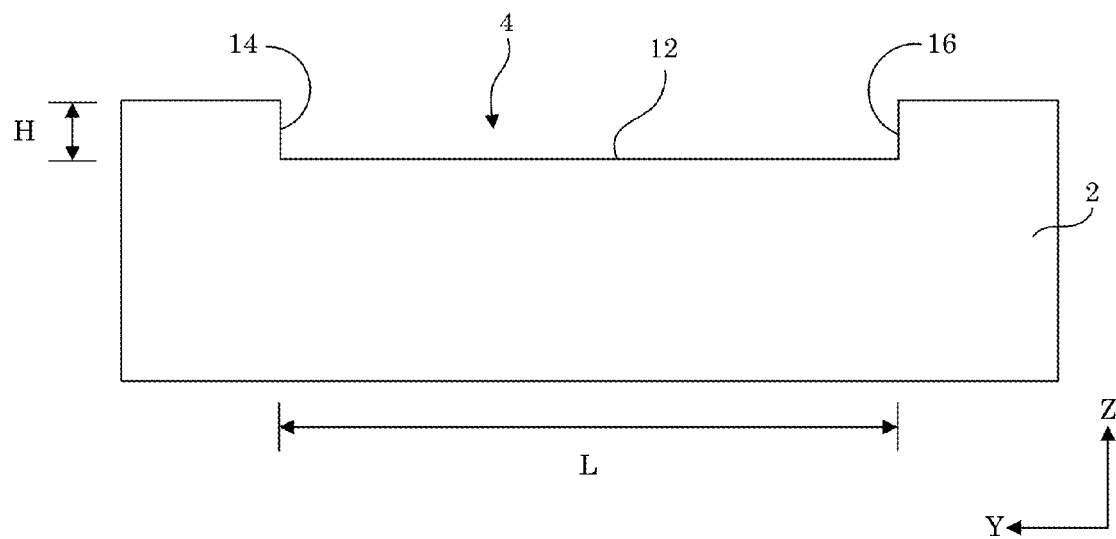

In an embodiment, nanoduct 4 is a divergent truncated frustocone as shown in FIG. 15 and FIG. 16. Here, angle of divergence Q of sidewalls (8, 10) is an angle between the anisotropic etch direction and a divergence direction of sidewall (8 or 10).

Figure 17:
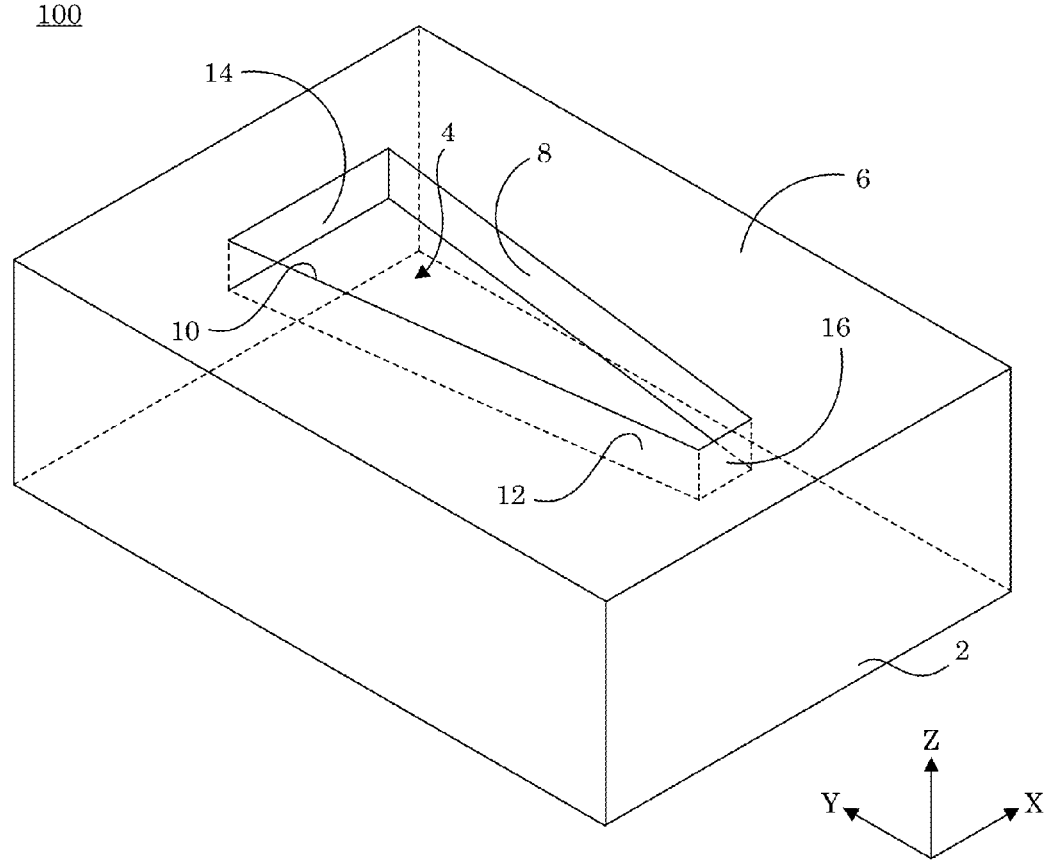
FIG. 17 shows a nanoduct that includes a convergent truncated frustonical nanochannel disposed on a semiconductor substrate in which panel A shows a perspective view, and panel B shows a top view.
Figure 17:
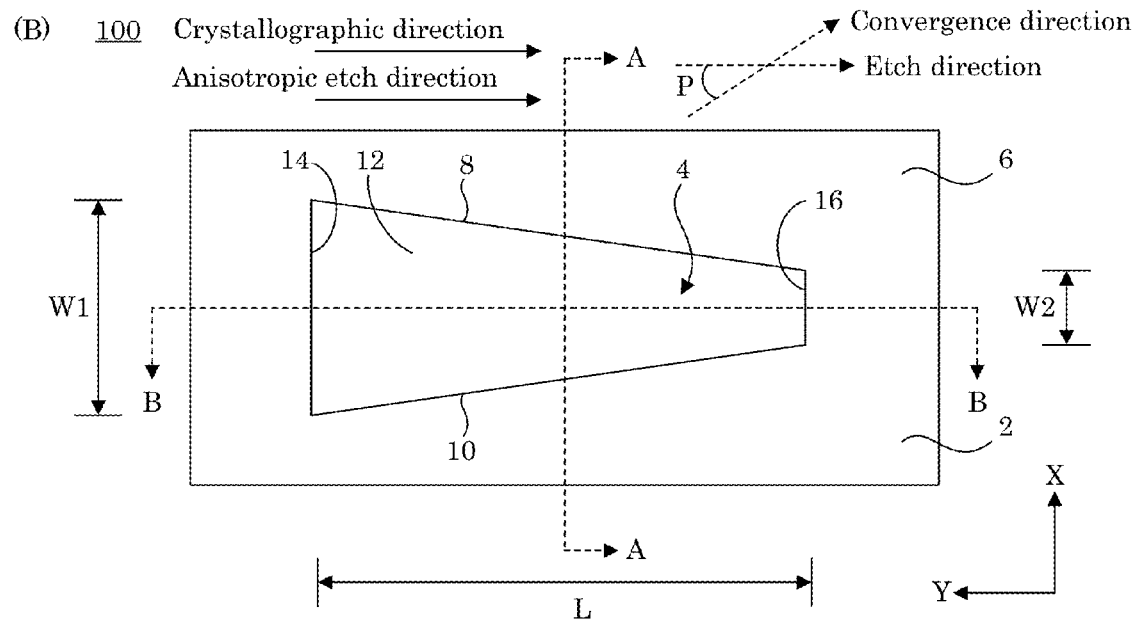
Figure 18:
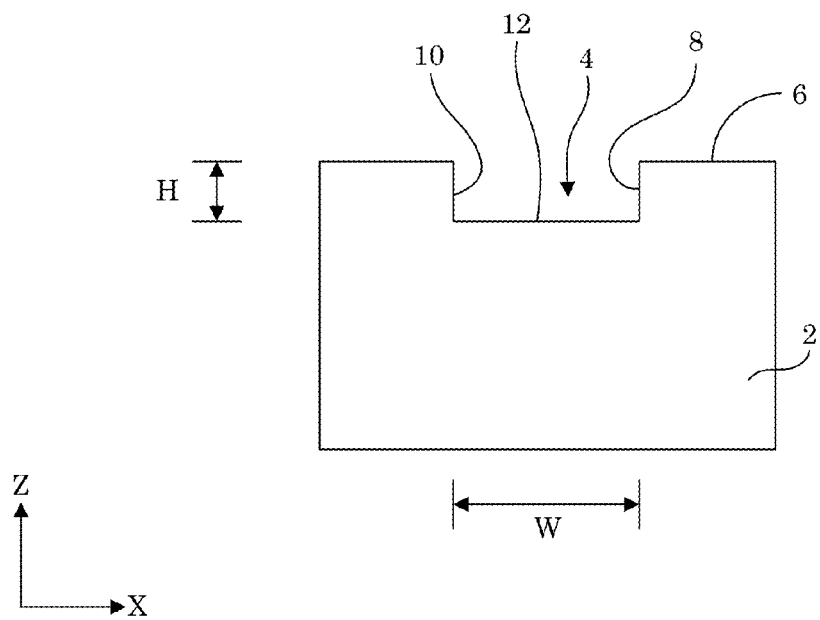
FIG. 18 shows a cross-section along line A-A of the nanoduct shown in FIG. 15, and panel B shows a cross-section along line B-B of the nanoduct shown in FIG. 15.
Figure 18:
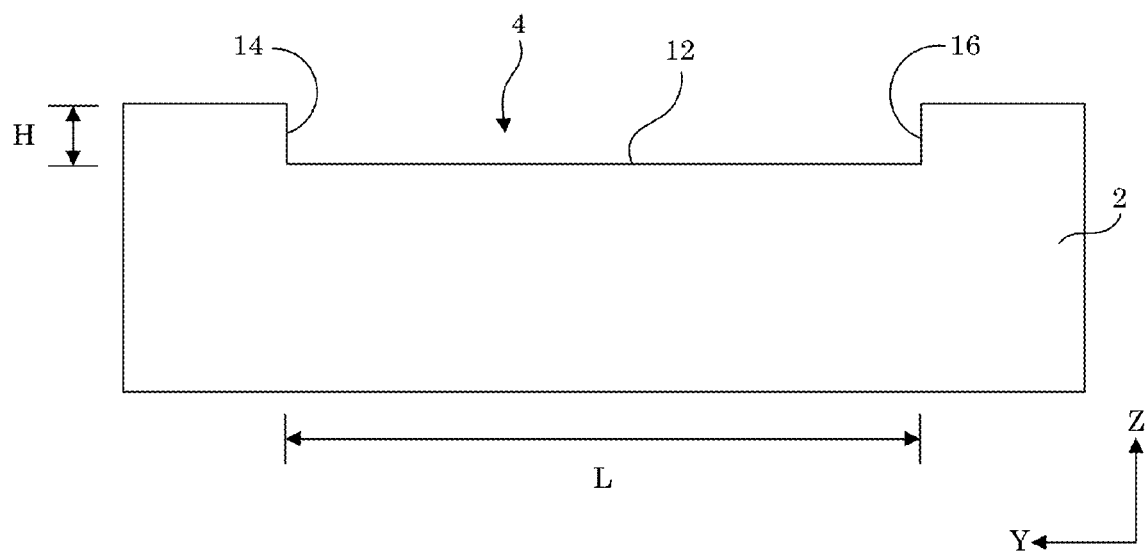

In an embodiment, nanoduct 4 is a convergent truncated frustocone as shown in FIG. 17 and FIG. 18. Here, angle of convergence P of sidewalls (8, 10) is an angle between the anisotropic etch direction and a convergence direction of sidewall (8 or 10).

Figure 19:
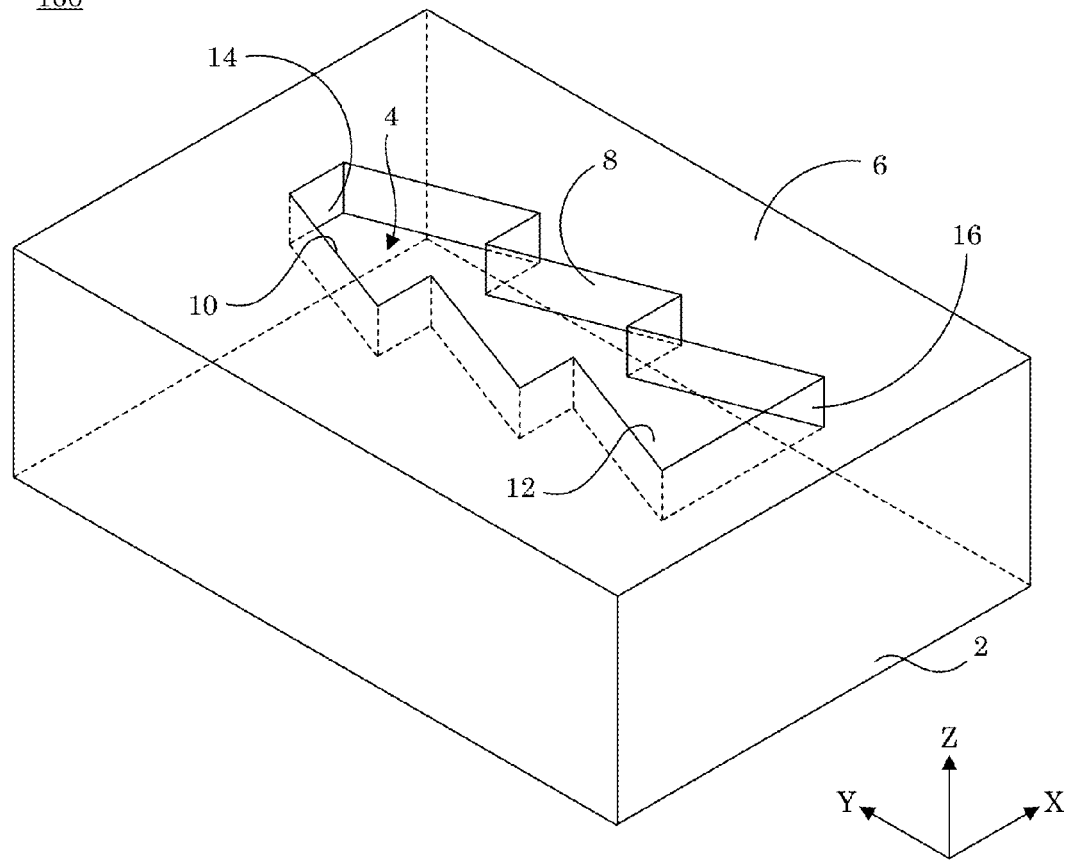
FIG. 19 shows a nanoduct that includes a repeated divergent truncated frustonical nanochannel disposed on a semiconductor substrate in which panel A shows a perspective view, and panel B shows a top view.
Figure 19:
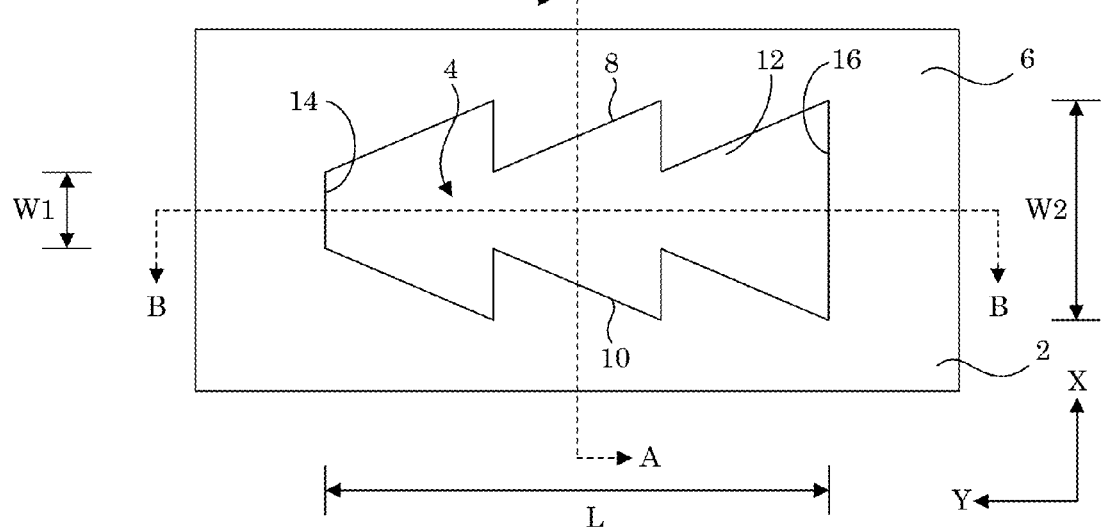

It is contemplated that the anisotropic etching of semiconductor substrate 2 by the etchant catalyst can be controlled to form nanoduct 4, wherein nanoduct 4 includes a nanochannel, nanotunnel, or a combination thereof. Moreover, Nanoduct 4 can include a nanofrustocone, truncated nanofrustocone, or a combination thereof, as shown in FIG. 19.

Nanoduct article 100 includes semiconductor substrate 2. In an embodiment, semiconductor substrate 2 includes a semiconductor. An exemplary semiconductor is an element from group 11, 12, 13, 14, 15, or 16 (IUPAC nomenclature, which respectively is identical to group I, II, III, IV, V, or VI) of the periodic table such as a Si, Ga, Ge, As, In, Sn, Sb, Te, At, Hf, Zn, and the like, or a combination thereof. In an embodiment, semiconductor substrate 2 is silicon. In an embodiment, semiconductor substrate 2 is gallium arsenide. According to an embodiment, semiconductor substrate 2 is a compound semiconductor such as SiC, SiGe, GaN; a group 13-15 (also referred to as a group III-V) semiconductor such as AlSb, AlAs, AlN, AlP, BN, GaSb, GaAs, GaN, GaP, InSb, InAs, InN, InP, and the like; a group 12-16 (group II-VI) semiconductor such as CdSe, CdS, CdTe, ZnO, ZnSe, ZnS, ZnTe, and the like; a group 11-17 (group I-VII) semiconductor such as CuCl and the like; a group 14-16 (group IV-VI) semiconductor such as PbS, PbTe SnS, and the like; a layer semiconductor such as $PbI_2$, $MoS_2$, GaSe, and the like; an oxide semiconductor such as CuO, $Cu_2O$, and the like; (ALGa)N, (Al,Ga)As, (In,Ga)As, (Al,Ga)Sb, (In,Ga)Sb, as well as nitride, arsenide, antimonide quaternary III-V alloys, or a combination comprising at least one of the foregoing. Examples of II-VI alloys include, but are not limited to CdSe, CdTe, CdS, ZnSe, and combinations thereof. Examples of Group III-V ternary alloys include, but are not limited to, (Ga,Al)As, (In,Ga)As, and combinations thereof. Exemplary Group III-V quaternary alloys include (Ga,In)(As,P), (In,Al,Ga)Sb, and the like. Exemplary Group III-nitride alloys include (Ga,Al)N, (Ga,In)N, (Al,In)N, (Ga,Al,In)N, and combinations thereof. Quaternary alloys of the above can also be employed as semiconductor substrate 2.

Semiconductor substrate 2 also can include a supplemental element such as C, H, N, Li, Na, K, Mg, Ca, Sr, Ba, Bi, B, Al, P, S, O, and the like in an amount typically less than an amount of the semiconductor. In an embodiment, semiconductor substrate 2 includes silicon, and the silicon is optionally doped. According to an embodiment, the semiconductor is an intrinsic semiconductor or an extrinsic semiconductor doped with a selected dopant, e.g., a p-dopant or an n-dopant. In one embodiment, semiconductor substrate 2 includes a p-dopant. In another embodiment, semiconductor substrate 2 includes an n-dopant. In a particular embodiment, semiconductor substrate 2 is p-doped Si. In one embodiment, semiconductor substrate 2 is n-doped Si. Semiconductor substrate 2 can be produced, e.g., from commercially available semiconductor grade p-doped Si having a particular crystalline orientation, e.g., having Miller indices <111>, <100>, and the like. Semiconductor substrate 2 can be polycrystalline or a single crystal. In an embodiment, semiconductor substrate 2 has a stacked structure that includes a plurality of semiconductor layers such as by forming films as SiGe/Si/SiGe/Si on the Si semiconductor substrate 2. In some embodiments, semiconductor substrate 2 includes crystalline domains among amorphous material in which the crystalline domains are subjected to anisotropic etching by the etchant catalyst to form nanoduct 4 in the crystalline domain.

Nanoduct article 100 includes nanoduct 4 disposed on semiconductor substrate 2. Nanoduct 4 is formed by anisotropically etching the semiconductor substrate 2 by the etchant catalyst. The etchant catalyst is selected to anisotropically etch semiconductor substrate 2 in an etch direction that is coincident with a single crystallographic direction of semiconductor substrate 2 at surface 6. Exemplary etchant catalysts include a transition metal (e.g., gold, silver, copper, mercury, and the like, or a combination thereof), a p-block element from the periodic table of elements (e.g., gallium, bismuth, indium, tin, and the like, or a combination there of), and the like, or a combination thereof.

In an embodiment, the etchant catalyst includes gold, and semiconductor substrate 2 is silicon. In an embodiment, the etchant catalyst includes gallium, and semiconductor substrate 2 is gallium arsenide.

Nanoduct article 100 includes nanoduct 4 disposed on semiconductor substrate 2. Length L of nanoduct 4 can be from 10 nanometers (nm) to 2 centimeters (cm), specifically 10 nm to 100 millimeters (mm), and more specifically from 5 nm to 10000 micrometer (μm). Width W of nanoduct 4 can be from 1 nm to 100 nm, specifically 5 nm to 50 nm, and more specifically from 5 nm to 0.05 μm. Height H of nanoduct 4 can be from 1 nm to 300 nm, specifically 5 nm to 100 nm, and more specifically from 10 nm to 0.05 μm.

Nanoduct 4 is formed by anisotropically etching the semiconductor substrate 2 by the etchant catalyst in a presence of the oxidant. The oxidant is selected to react with atoms or molecules from semiconductor substrate 2 to form volatile species that are released as a produce gas from the etchant catalyst or semiconductor substrate 2. Exemplary oxidants include an oxide (e.g., $O_2$, $H_2O$, a metal oxide ($M_xOy$ (wherein M is an alkali metal, alkaline earth metal, or transition metal; x is a real number from 0.1 to 20, and y is a real number from) such as $SiO_x$, Al2O3, copper oxide, or hydrates thereof such as $M_x(OH)_y$); nitrogen oxide (e.g., $N_xOy$ (wherein x and y are a real numbers independently from 0.1 to 20, and y is a real number), alcohol (e.g., methanol and the like), oxyacid (e.g., $HNO_3$ and the like), peroxide, and the like, or a combination thereof. Exemplary peroxides include inorganic and organic peroxides such as ketone peroxides, diacyl peroxides, diakyl peroxides, peroxyesters, peroxyketals, hydroperoxides, peroxydicarbonates, and peroxymonocarbonates. Exemplary peroxide initiator compounds include, but are not limited to, hydrogen peroxide, peroxydisulfate salts, persulfate salts acetylacetone peroxide, methylethylketone peroxide, cyclohexanone peroxide, methylisobutylketone peroxide; benzoyl peroxide, lauroyl peroxide, isobutyryl peroxide, acetyl peroxide, 2,4-dichlorobenzoyl peroxide, succinic acid peroxide, decanoyl peroxide, diisononanoyl peroxide; tert-butyl peroxide-2-ethyl hexanoate; 1,1-ditert-butylperoxy-3,3,5-trimethyl cyclohexane, and 1,3-bis(tert-butylperoxyisopropyl)benzene, and the like, or a combination thereof.

In an embodiment, the oxidant is a fluid. According to an embodiment, the oxidant is a gas. In an embodiment, the oxidant is water, specifically water vapor. Here, semiconductor substrate 2 can be indium phosphide, and the etchant catalyst can be gold. Accordingly, upon heating semiconductor substrate 2 to a temperature effective for anisotropic etching of InP semiconductor substrate 2 by the Au etchant catalyst, introducing the water vapor oxidant provides formation of nanoduct 4 by an oxidative reaction between the oxidant and atoms or molecules from indium phosphide semiconductor substrate 2 to form volatile reaction products that include oxides of indium (InO) and oxides of phosphorus (PO) that escape from the gold etchant catalyst and indium phosphide semiconductor substrate 2. It is contemplated that the reaction products can be in various oxidation states.

Nanoduct article 100 includes nanoduct 4 disposed on semiconductor substrate 2. Nanoduct 4 can include the nanotunnel bounded by covering layer 30. Covering layer 30 is selected to allow anisotropically etching of semiconductor substrate 2 in covered portion 32. Exemplary covering layers 30 include films of porous or non-porous structures made of elements of groups I, II, III, IV, V, VI (e.g., C, Si, Ge, and the like), or their oxides such as $SiO_x$, and the like, or a combination thereof.

In an embodiment, covering layer 30 includes carbon.

Nanoduct article 100 includes nanoduct 4 disposed on semiconductor substrate 2. Nanoduct 4 is formed by anisotropically etching the semiconductor substrate 2. Blocking layer 40 inhibits etching of semiconductor substrate 2 and blocking portion 47. Exemplary blocking layer 40 include elements of groups I, II, III, IV, V, VI (e.g., Pt, Pd, and the like, or a combination thereof), and the like, or a combination thereof.

In an embodiment, blocking layer 40 includes Pt.

Figure 20:
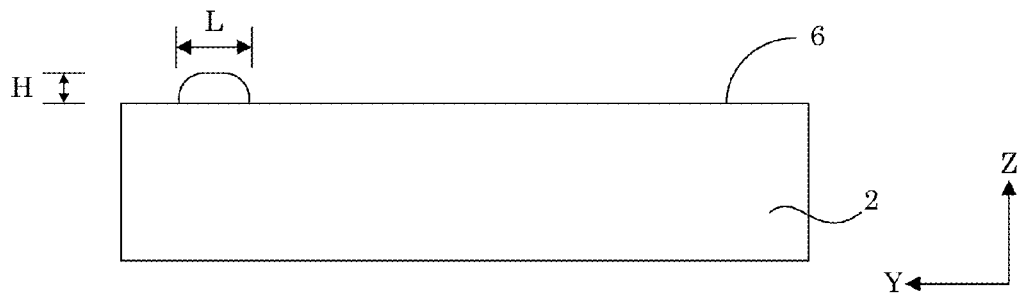
FIG. 20 shows steps involved in making a nanoduct.
Figure 20:
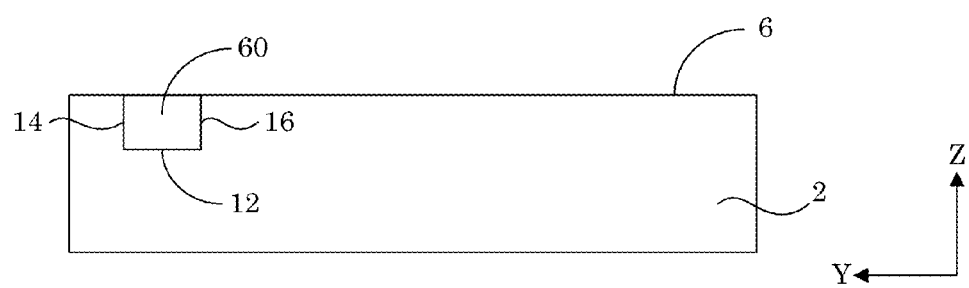
Figure 20:
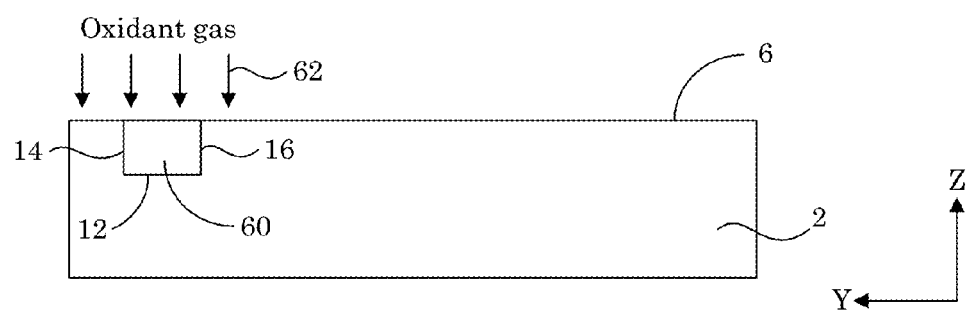
Figure 20:
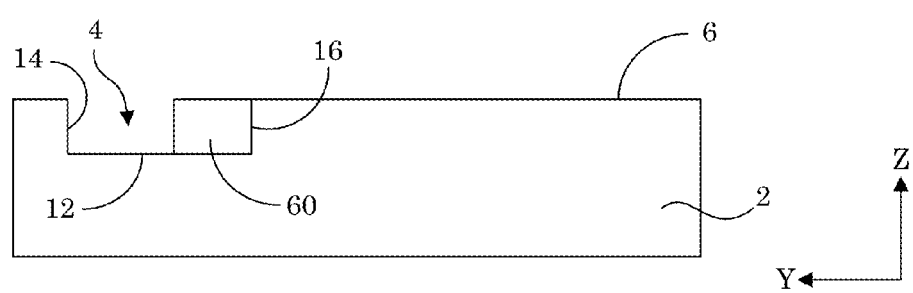
Figure 20:
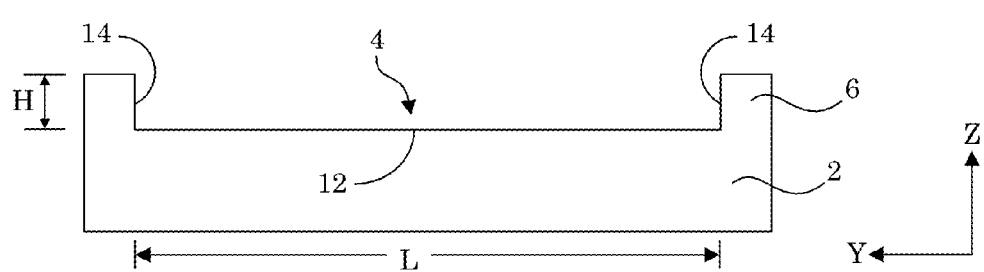

In an embodiment, with reference to FIG. 20, a process for making nanoduct 4 includes disposing etchant catalyst 60 on semiconductor substrate 2 that includes a single crystal structure (panel A); heating semiconductor substrate 2 to an etching temperature (panel B); introducing oxidant 62; contacting semiconductor substrate 2 with oxidant 62 in a presence of etchant catalyst 60 (panel C); anisotropically etching semiconductor substrate 2 by etchant catalyst 60 in a presence of oxidant 62 in an etch direction that is coincident along a crystallographic axis of semiconductor substrate 2 (panel D); and forming nanoduct 4 as etchant catalyst 60 propagates along surface 6 of semiconductor substrate 2 during anisotropically etching semiconductor substrate 2 (panel E). As a result, nanoduct 4 is crystallographically aligned with the crystallographic axis of semiconductor substrate 2. As used here in, "crystallographically aligned" refers to length L of nanoduct 4 being parallel to a single crystallographic axis of semiconductor substrate 2. It is contemplated that semiconductor substrate 2 has three crystallographic axes that can be labeled with Miller indices denoted as <a, b, c>, wherein length L of nanoduct 4 is parallel to one of the crystallographic axes corresponding to Miller index a, b, or c. As shown in panel D, etchant oxidizer 60 sinks into semiconductor substrate 2 during heating semiconductor substrate 2 to the etching temperature. As a result, aft wall 14, duct wall 12, and fore wall 16 are formed. Subsequently as etchant catalyst 60 anisotropically etches semiconductor substrate 2, length L between aft wall 14 and fore wall 16 increases.

Figure 21:
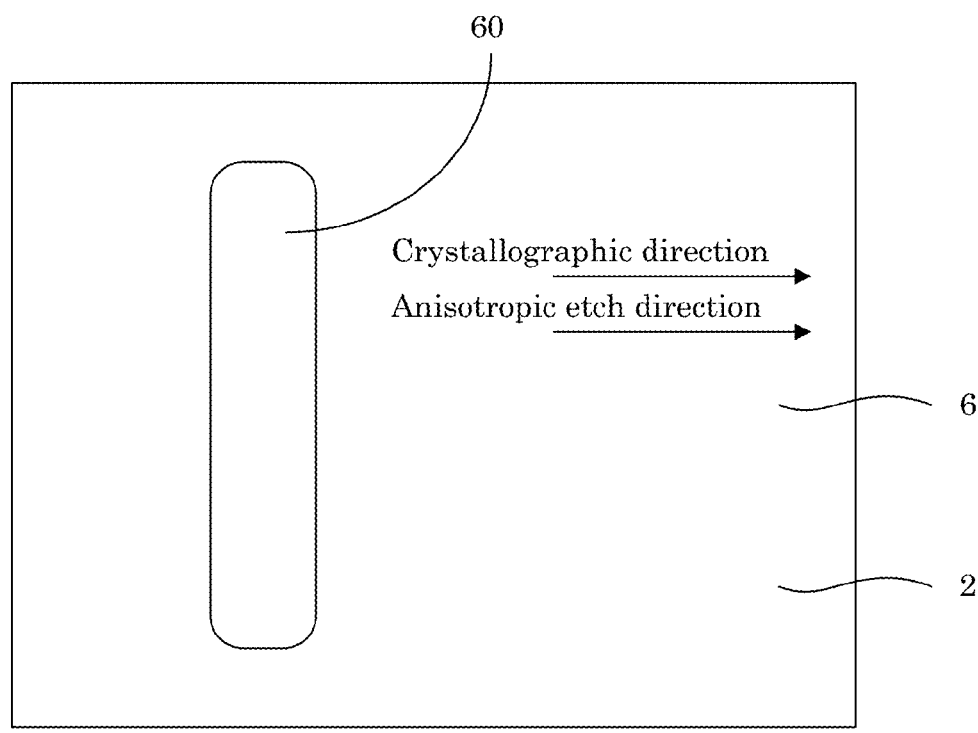
FIG. 21 shows a pattern of an etchant catalyst disposed on a semiconductor substrate in which panel A shows a linear pattern of the etchant catalyst, and panel B shows a plurality of etchant catalysts disposed as discrete spots.
Figure 21:
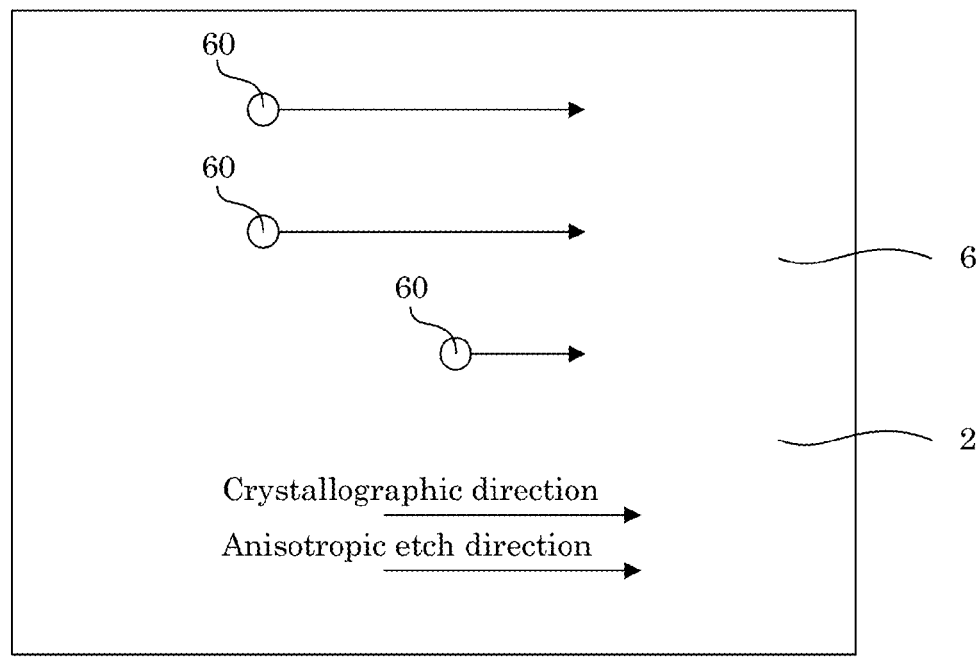

The process for making nanoduct 4 further can include forming a pattern of etchant catalyst 60 on surface 6 of semiconductor substrate 2 prior to introducing oxidant 62. As shown in FIG. 21, the pattern of etchant catalyst 60 can be various shapes including lines as shown in panel A, dots (or droplets) as shown in panel B, circles, a serpentine shape, a polygonal shape, and the like without limitation provided anisotropic etching of semiconductor substrate 2 by etchant catalyst 60 can occur at the etching temperature in a presence of oxidant 62. In an embodiment, the process includes forming a plurality of droplets including etchant catalyst 60 in response to heating semiconductor substrate 2.

According to an embodiment, the process includes dissolving, by etchant catalyst 60, a portion of semiconductor substrate 2 in contact with etchant catalyst 60 during anisotropically etching semiconductor substrate 2.

The process can include converting the portion of semiconductor substrate 2 to a volatile oxide during anisotropically etching semiconductor substrate 2. Converting the portion of semiconductor substrate 2 to the volatile oxides can include reacting the portion of semiconductor substrate 2 with oxidant 62 to form the volatile oxide.

In an embodiment, the process includes disposing covering layer 30 on semiconductor substrate 2 to form covered portion 32 of semiconductor substrate 2. Further, the process can include anisotropically etching covered portion 32 of semiconductor substrate 2 by etchant catalyst 60 in presence of oxidant 62 in the etch direction that is coincident along the crystallographic axis of semiconductor substrate 2; and forming nanoduct 4 including the nanotunnel in covered portion 32 of semiconductor substrate 2 in response to anisotropically etching covered portion 32.

In an embodiment, the process includes disposing blocking layer 40 on semiconductor substrate 2 to form blocking portion 47 of semiconductor substrate 2. Further, the process can include terminating the anisotropically etching of semiconductor substrate 2 at blocking portion 47.

Nanoduct article 100 has numerous beneficial uses, including control of a dimension (length L, width W, or height H) of nanoduct 4 as well as site specific coating or blockage of nanoduct 4 are contemplated. Accordingly, the process for making nanoduct 4 can including scalable surface nanoengineering. Further contemplated is development of advanced materials as well as multifunctional heterogeneous nanosystems including electro-optical and nanofluidics using nanoduct article 100.

Nanoduct article 100 has numerous advantageous and beneficial properties. Nanoduct 4 can block or permeate molecules and particles based on their size, shape and weight. Hence, nanoduct article 100 can be used as filter, separator, or concentrator in micro- or nano-fluidic platforms.

Advantageously and unexpectedly, etchant catalyst 60, e.g., Au, that has a certain size alloys with atoms in semiconductor substrate 2 and, in a presence of oxidant 62, locally catalyzes oxidation of semiconductor substrate 2 to anisotropically etch semiconductor substrate 2 along the crystallographic direction of semiconductor substrate 2. Beneficially, the oxidized elements depart the alloyed etchant catalyst droplet and provide nanoduct 4. Au etchant catalysts with very small sizes travel long distances and form nanoduct 4 that is crystallographically aligned with surface 6 of semiconductor substrate 2.

The articles and processes herein are illustrated further by the following Example, which is non-limiting.

Example

Anisotropic etching of a surface of a semiconductor substrate by gold nanodroplet etchant catalyst to form a nanoduct.

Self-assembly of semiconductor nanostructures has always held a great fascination, as it opens up new possibilities for nanoscale technologies and at the same time offers novel growth phenomena of fundamental interest. In this regard, formation of a nanoduct occurs via metal-catalyzed vapor-liquid-solid (VLS) anisotropic etching of a semiconductor substrate. Here, a nanoscale Au alloy droplet is the etchant catalyst and moves along a surface of the semiconductor substrate, leaving behind a long, straight nanoduct. The nanoduct is crystallographically aligned, smooth, and free of residue. The process occurs on semiconductors such as InP, GaP, InAs, and the like when water vapor is introduced. This process has diverse applications that include cutting apart regions of a thin film, being a template for subsequent growth of nanostructures, integration of electro-optical microdevices with nanofluidic platforms, and the like.

Without wishing to be bound by theory, it is believed that to form the nanoduct in the semiconductor substrate, the Au etchant catalyst dissolves a portion of the surface of the semiconductor substrate and catalyzes a reaction with the water vapor oxidant to convert the dissolved portion of the semiconductor substrate to volatile oxides that escape as vapor. Accordingly, this anisotropic etching provides continuous, linear growth of the nanoduct with a diameter (i.e., width) determined by the size of the etchant catalyst particle.

Figure 22:
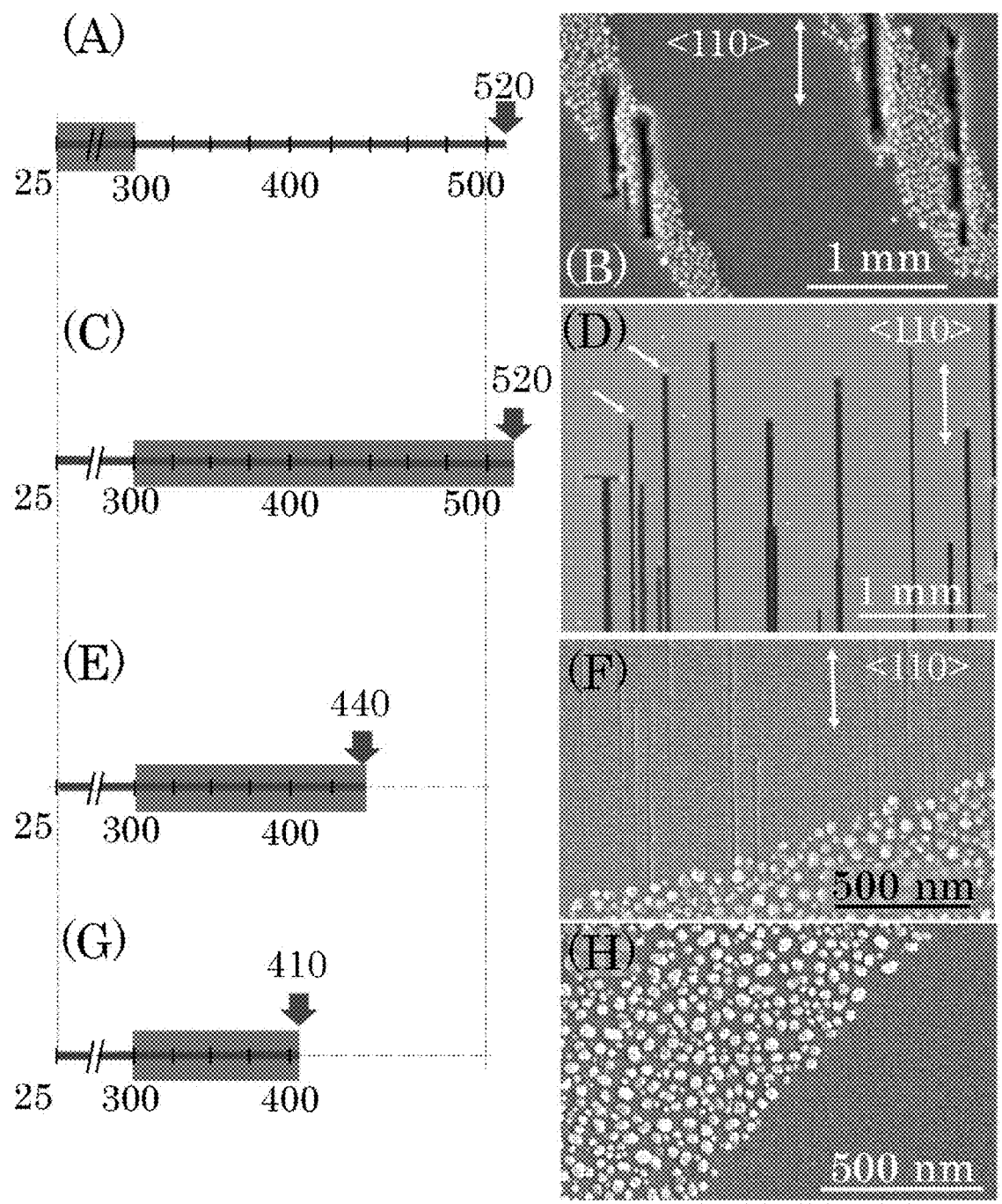
FIG. 22 shows a change in a surface structure of InP (001) coated with 7 nm thick Au patterns upon increasing a water content of a carrier gas in which panel A shows introduction of water vapor from 25° C. to 300° C.; panel B shows a scanning electron microscope (SEM) image of thick trenches formed in the Au pattern; panel C shows introduction of water vapor from 300° C. to 520° C.; panel D shows an SEM image of nanochannels formed at the edge of the Au pattern, wherein fore walls of the nanochannels include Au droplets that are indicated by arrows; panels E, F, G, and H show a minimum temperature to form nanochannels on InP, wherein below the minimum temperature Au droplets alloy with InP without appearance of nanochannels as shown in see panel G and panel H.
Figure 30:
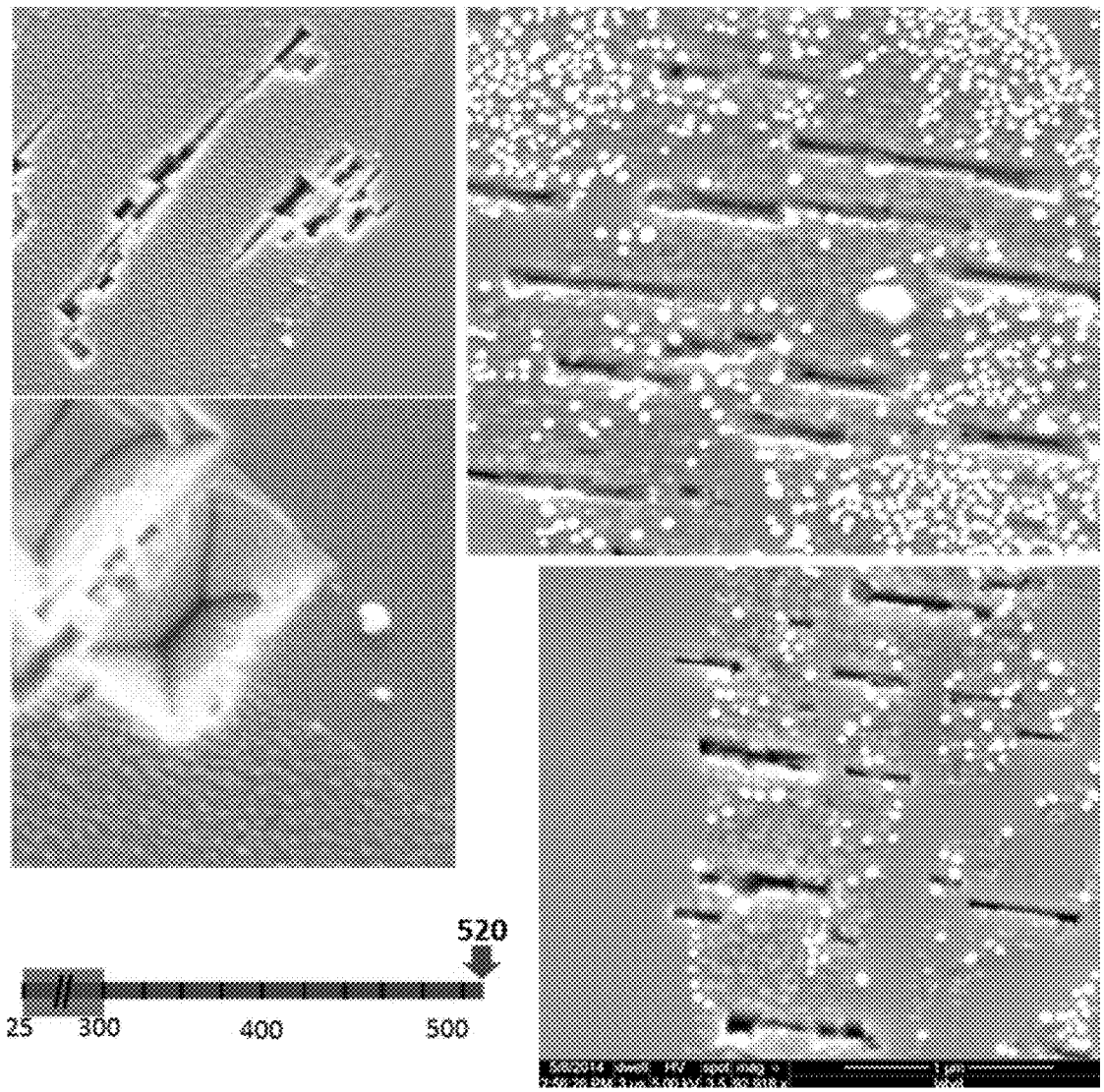
FIG. 30 shows nanochannels disposed in InP (100) formed in a presence water vapor introduced from room temperature to 300° C.
Figure 31:
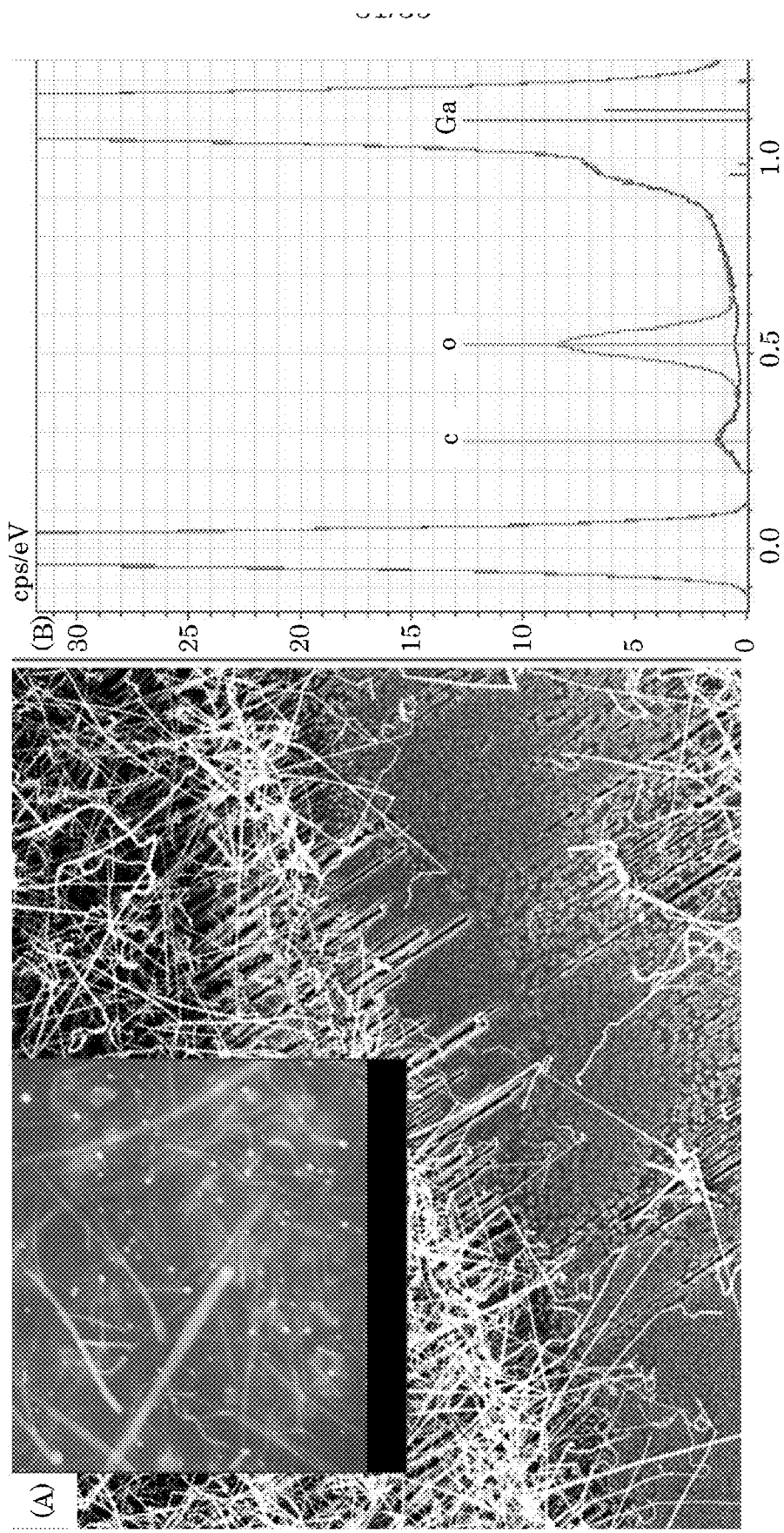
FIG. 31 shows, in panel A nanochannels disposed in GaP (100) at 800° C., wherein an inset shows free-standing nanowires removed from the GaP that have gold droplets at their ends, and panel B shows elemental composition of the free-standing nanowires that include GaO, and the nanowires are compared with elemental analysis of a clean, unreacted GaP wafer.

Here, a sample was prepared and included a semiconductor substrate that was an InP (001) single crystal in which the InP (001) surface was patterned with regions of very thin Au film, which breaks up into small particles of Au etchant catalyst upon heating. The sample was heated in a horizontal tube furnace with a ramp rate of 33° C./min under an ultra-dry nitrogen carrier gas and a flow rate of 0.5 standard liters per minute (SLPM). To introduce water vapor in the system, the carrier gas is bubbled through water at room temperature. Alternatively, hydration water of $MgSO_4 \cdot 7H_2O$ was used as a water source by heating its 98% powder when placed upstream relative to the gas flow direction under the specified heating condition above. For a 7 nm thick Au pattern on InP, if the carrier gas and water vapor are introduced while the temperature is below 300° C. (panel A of FIG. 22), InP shows etched pits that are formed within the Au coated areas as shown in panel B of FIG. 22 (see also FIG. 30). These faceted pits can merge and form larger oriented trenches in the <110> direction.

If instead the carrier gas and water vapor are introduced in the temperature range of 300° C. to 520° C. (see panel C of FIG. 22), long oriented nanochannels form on the InP (see panel D of FIG. 22). The leading ends of the resulting nanochannels contain Au droplets, as marked with arrows in FIG. 22. The nanochannel is formed by Au droplets at the periphery of the Au pattern that are mobile on the surface and form the nanochannels by metal-catalyzed anisotropic etching.

Figure 23:
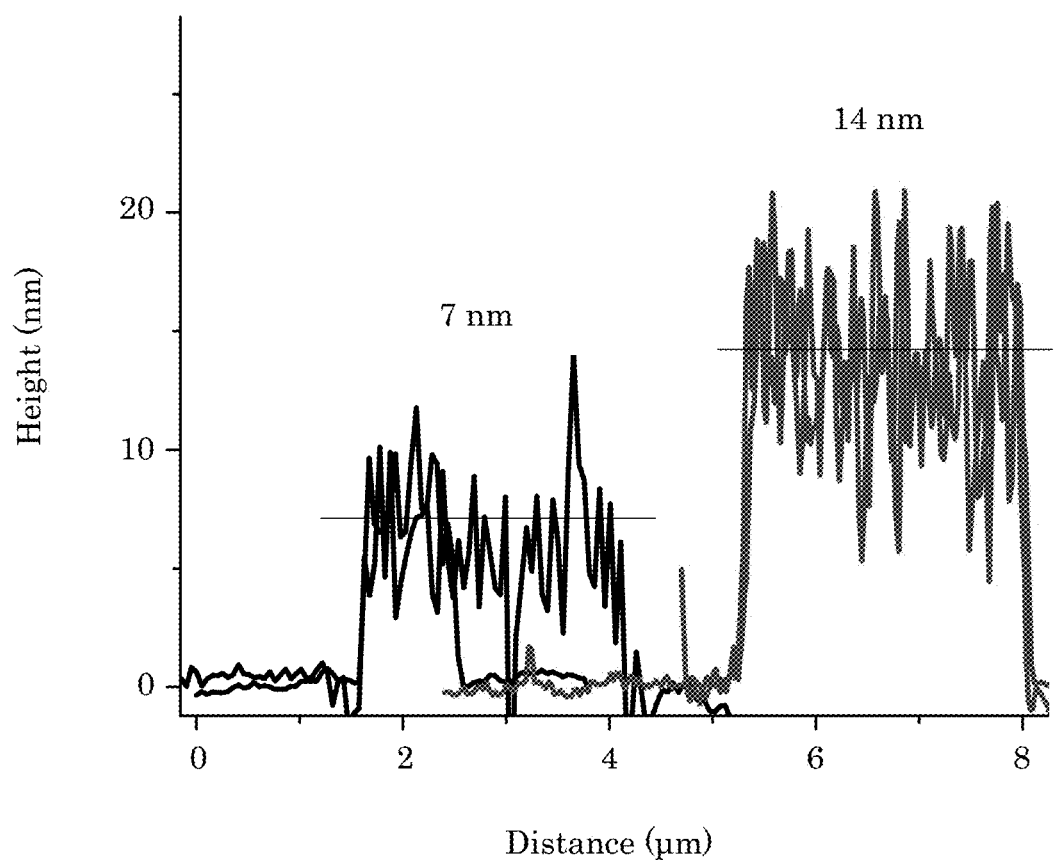
FIG. 23 shows a line profile from an atomic force microscope (AFM) analysis of the Au droplets before (dark line) and after heat treatment at 410° C. (red line) for the gold droplets show in panel H of FIG. 22.

In a study, the reaction was subjected to termination at lower temperatures. The minimum temperature required to observe nanochannels on InP was roughly 440° C. (see panel E and panel F of FIG. 22), below which temperature surface reaction did not occur (see panel G and panel H of FIG. 22) even in a presence of water vapor. Moreover, atomic force microscopy (AFM) size measurements (shown in FIG. 23) show a two-fold increase in the height of the Au droplets at 410° C. that indicated infusion of In or P into Au.

Figure 24:
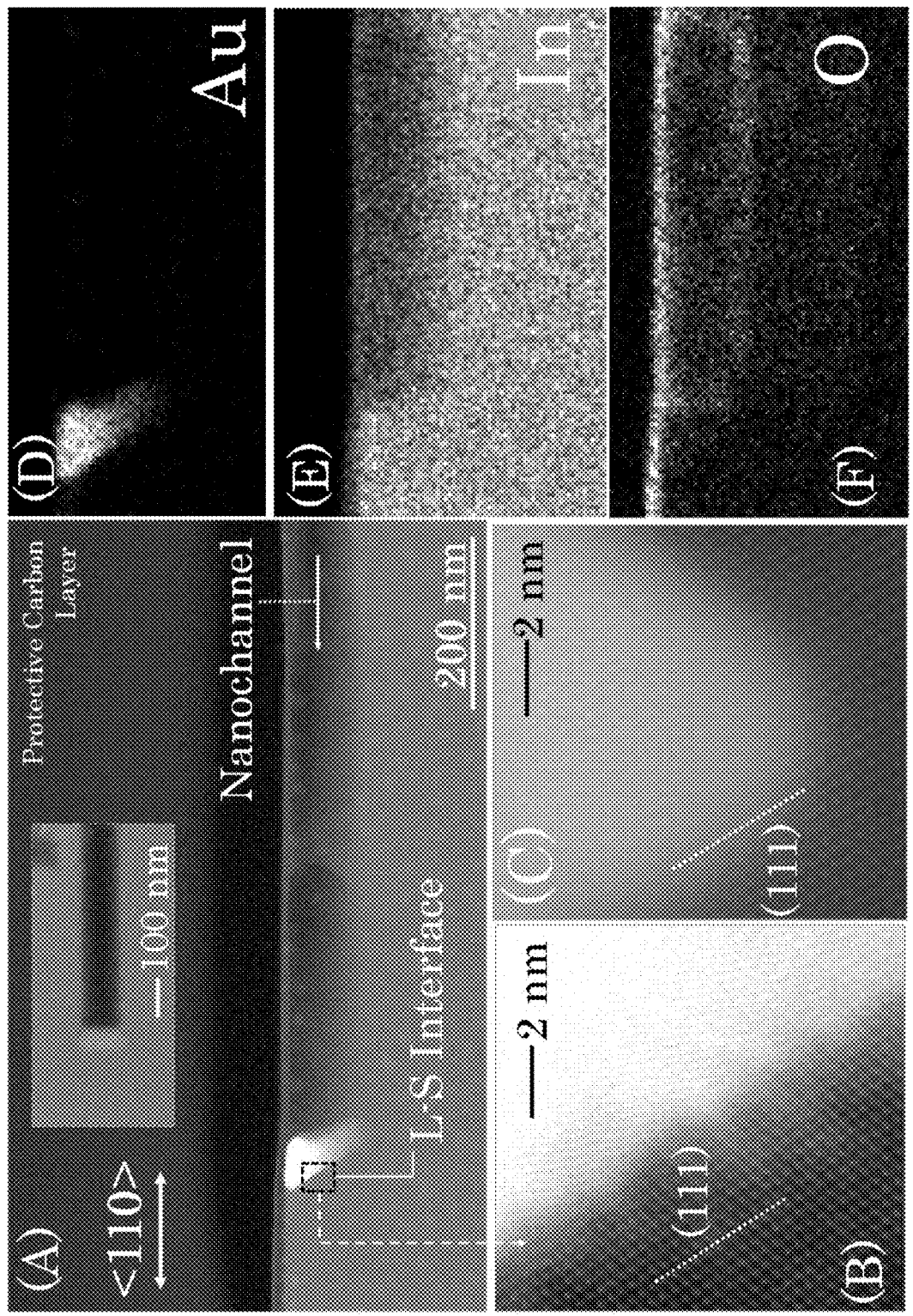
FIG. 24 shows (in panel A) a scanning transmission electron microscopy in a high-angle annular dark field (STEM-HAADF) image of a cross-section of a nanochannel along its length formed on InP (100), wherein the growth direction of the nanochannel was <110>; the upper half of the image shows a protective carbon layer; the bright region at the left end of the nanochannel is an Au catalyst droplet, and the inset is an SEM image showing a top view of the nanochannel; panel B shows an STEM-HAADF image of Au catalyst at its nearly flat interface with InP (111); panel C shows an STEM-HAADF image of the cross-section of a nanochannel along its width that includes the InP (111) planes and a V-shaped profile; and panel D, E, and F respectively show elemental maps of Au, In, and O collected from the image shown in panel A.

Panel A of FIG. 24 shows the cross-section of a nanochannel along its length (inset shows plan view) illustrating the position and shape of the Au droplet at its leading edge and the lattice void left behind by the droplet motion. Examining the interface of Au/InP in panel B of FIG. 24 using scanning transmission electron microscopy in a high-angle annular dark field mode (STEM-HAADF) shows the sharp interface is made from a (111) plane of single crystal InP interfaced with Au. TEM analysis also shows the interface is free of any new crystal phases, amorphous or intermediary layers. A cross-section along the channel width (panel C of FIG. 24) shows a crystalline V-shaped groove, reflecting the slow etch rate of the (111) planes relative to the (100) at the bottom of the channel. During the reaction (at elevated temperatures), the liquid AuIn alloy would presumably have a flat interface with InP (111) at the etch front and a round shape at the L-V interface much like what is observed in VLS growth of nanowires.

As the temperature drops below the miscibility range of Au/In, some of the excess In, which remains quite mobile, diffuses away and leaves Au. In this process, the metal alloy shrinks and its free surface becomes distorted as seen in the cross-section of panel A of FIG. 24. Elemental maps acquired via X-ray energy dispersive spectroscopy (XEDS) show that the Au particle (panels D and E of FIG. 24) still contains a few % In. Oxygen is also detected in the Au particle (panel F of FIG. 24), most likely indicative of residual oxidized In and P species. This oxidation is believed to occur by reaction with water at the droplet surface, as no gas phase decomposition of water is expected at the applied temperature.

Figure 25:
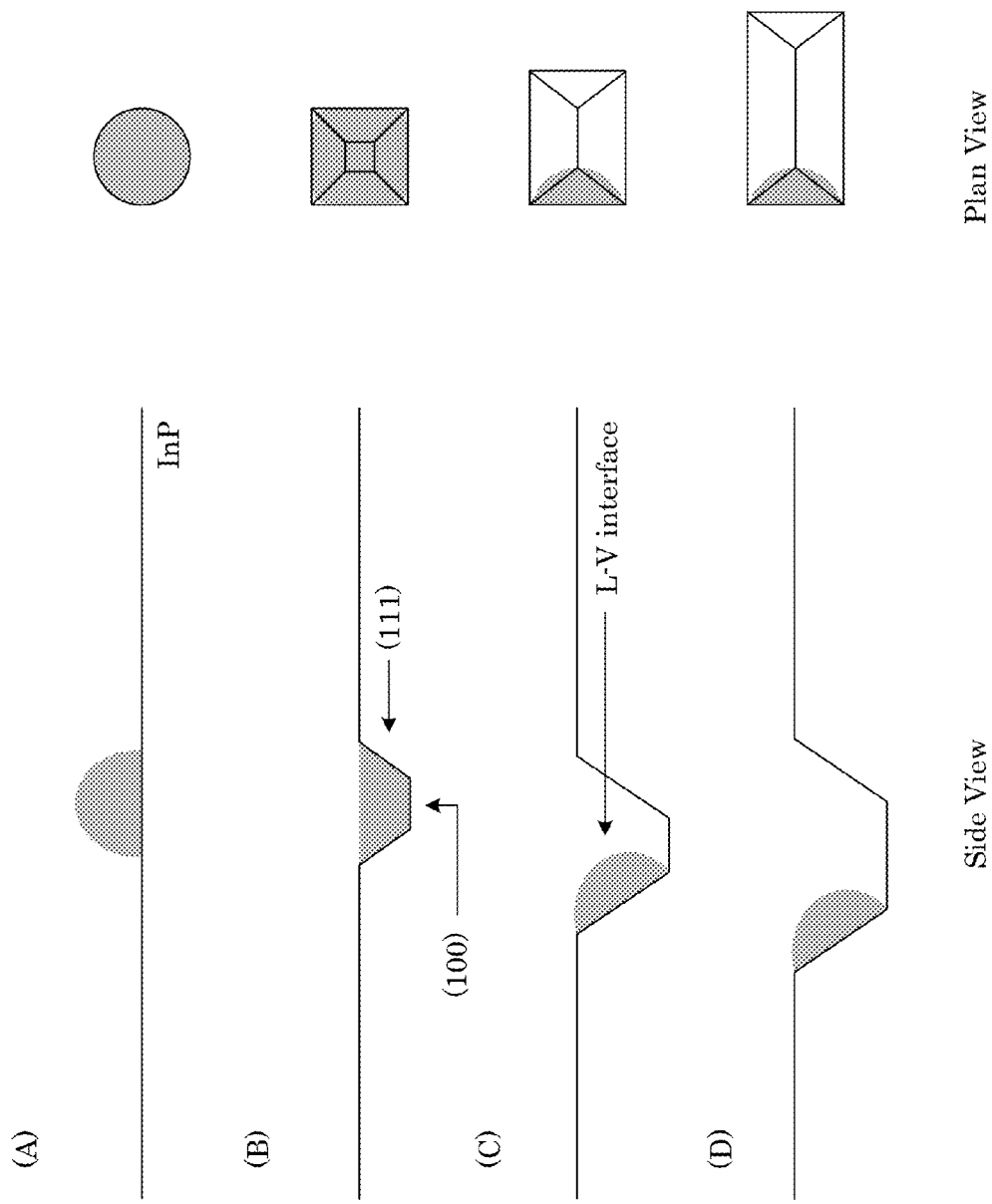
FIG. 25 shows a vapor-liquid-solid (VLS) etch mechanism illustrated in side views (left-hand side) and top views (right-hand side), wherein panel A shows an etchant catalyst that includes gold alloying with atoms from an InP semiconductor substrate; panel B shows the Au etchant catalyst sinks into the InP semiconductor substrate and forms sidewall (111 facet) and duct wall (100 facet), and panel C and D show, at a high temperature, the InP semiconductor substrate dissolves into the Au etchant catalyst, is oxidized, and removed as vapor from the Au etchant catalyst and semiconductor substrate to form a faceted nanochannel disposed on a surface of the InP semiconductor substrate and crystallographically aligned thereto.

As illustrated in FIG. 25, at the initial low temperatures, the Au droplet swells due to incorporation of In and P from the underlying substrate while sinking into the InP (panels A and B of FIG. 25) forming nanoscale pits with four (111) facets. Two of these facets are nominally In-terminated while the others are P-terminated. A difference in etch rate does not seem to play a role in anisotropic growth of Au-catalyzed nanochannels; ultimately the Au droplet only wets one of these facets and thus continues its reaction irrespective of the etch rates of the other facet (panels C and D of FIG. 25). Examining the orientation of the four side facets of a nanochannel indicate that nanochannels elongate from the P-terminated facets; therefore, a nanochannel has two possible growth directions, along [110] or [$\overline{1}\overline{1}0$].

Figure 32:
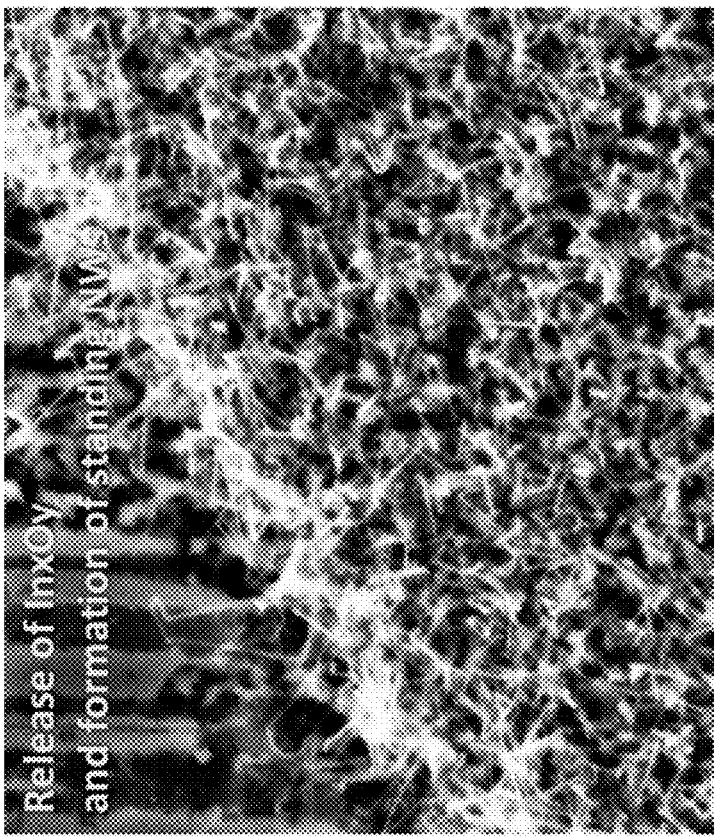
FIG. 32 shows, in panel A, nanochannels disposed on InAs (100) that were formed at 540° C., and panel B shows nanowires formed proximate to nanochannels were indium oxide.
Figure 32:
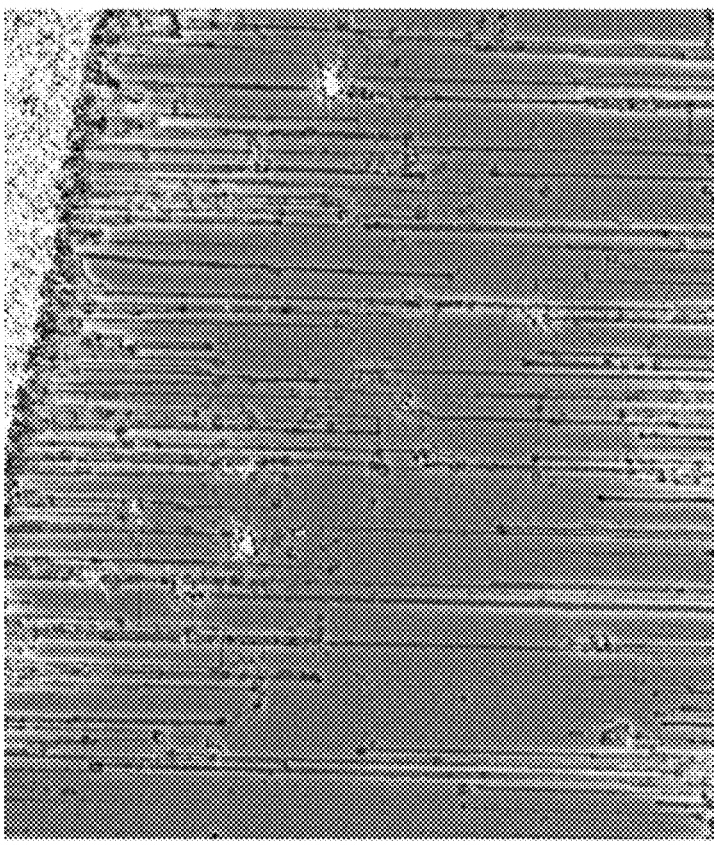

During the reaction, dissolved In and P saturate the Au droplet. In the presence of water, indium oxide and phosphorus oxide form at the droplet surface and then evaporate. The under-saturated droplet further dissolves the surrounding InP resulting in continuous etching of the substrate at the L-S interface. A similar process for surface-directed VLS etching of other semiconductors such as InAs and GaP at 540° C. and 800° C., respectively occurs. In those cases, free-standing nanowires of their metal oxides at the location of the original Au patterns on the substrate were observed (see FIG. 32).

The surface-directed VLS etch process for Au droplets as small as a few nanometers occurred, resulting in very narrow nanochannels on the surface. Examples of which are shown in panels A, B, C, and D of FIG. 26 where nanochannels more than 40 μm in length and as thin as 2 nm are formed from 3 nm thick Au patterns. As seen in panels A, B, and C of FIG. 26, the initial site of the nanochannels can be defined by the metal catalyst, with the substrate determining the <110> channel orientation.

Figure 26:
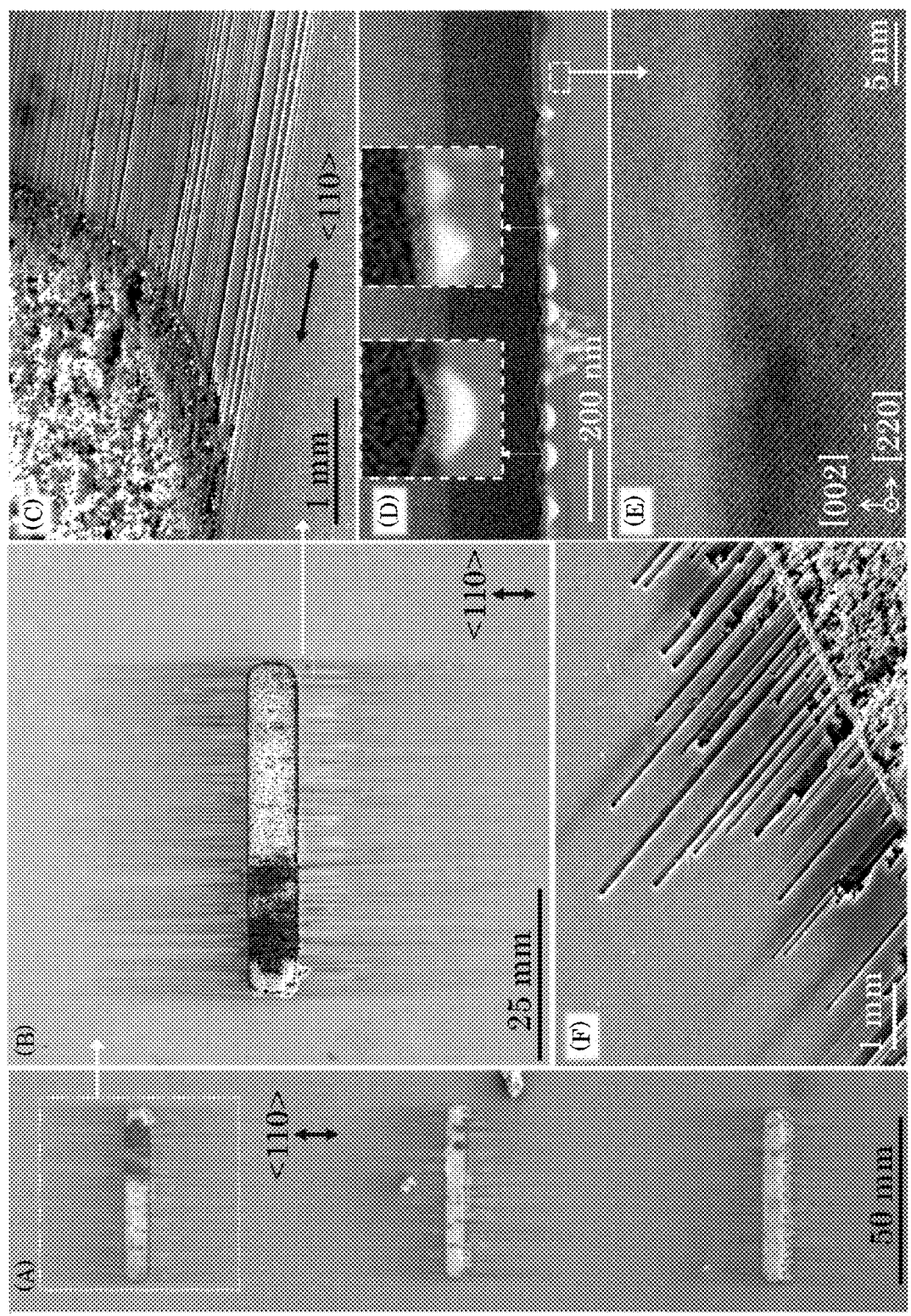
FIG. 26 shows, in panel A, a plurality of 3 nanometer (nm) thick lines of Au etchant catalyst deposited orthogonally to a <110> direction of an InP semiconductor substrate and that result in a plurality of nanochannels disposed on both sides of the lines of Au etchant catalyst, wherein white box surrounding the uppermost line of Au etchant catalyst is provided in a magnified view shown in panel B; panel B shows a surface density, directionality, and length of the nanochannels disposed on the InP semiconductor substrate; panel C shows a morphology of nanochannels at one end of the line of Au etchant catalyst, wherein a bulk of the line of the Au etchant catalyst reacts with InP, and the edge of the line of the Au etchant catalyst forms the nanochannels; panel D shows an STEM-HAADF image of a cross-section of long nanochannels, wherein an inset shows a zoomed view of cross-sections of nanochannels that have a V-shape or trapezoidal shape, and the highlighted box in red shows part of a 50 nm thick amorphous layer formed on a surface of the InP semiconductor substrate; panel E shows this interface obtained from a bright-field STEM image; and panel G shows that increasing the thickness (from 3 nm to 7 nm) of the line of the Au etchant catalyst provides formation of thicker nanochannels with well-developed facets.
Figure 27:
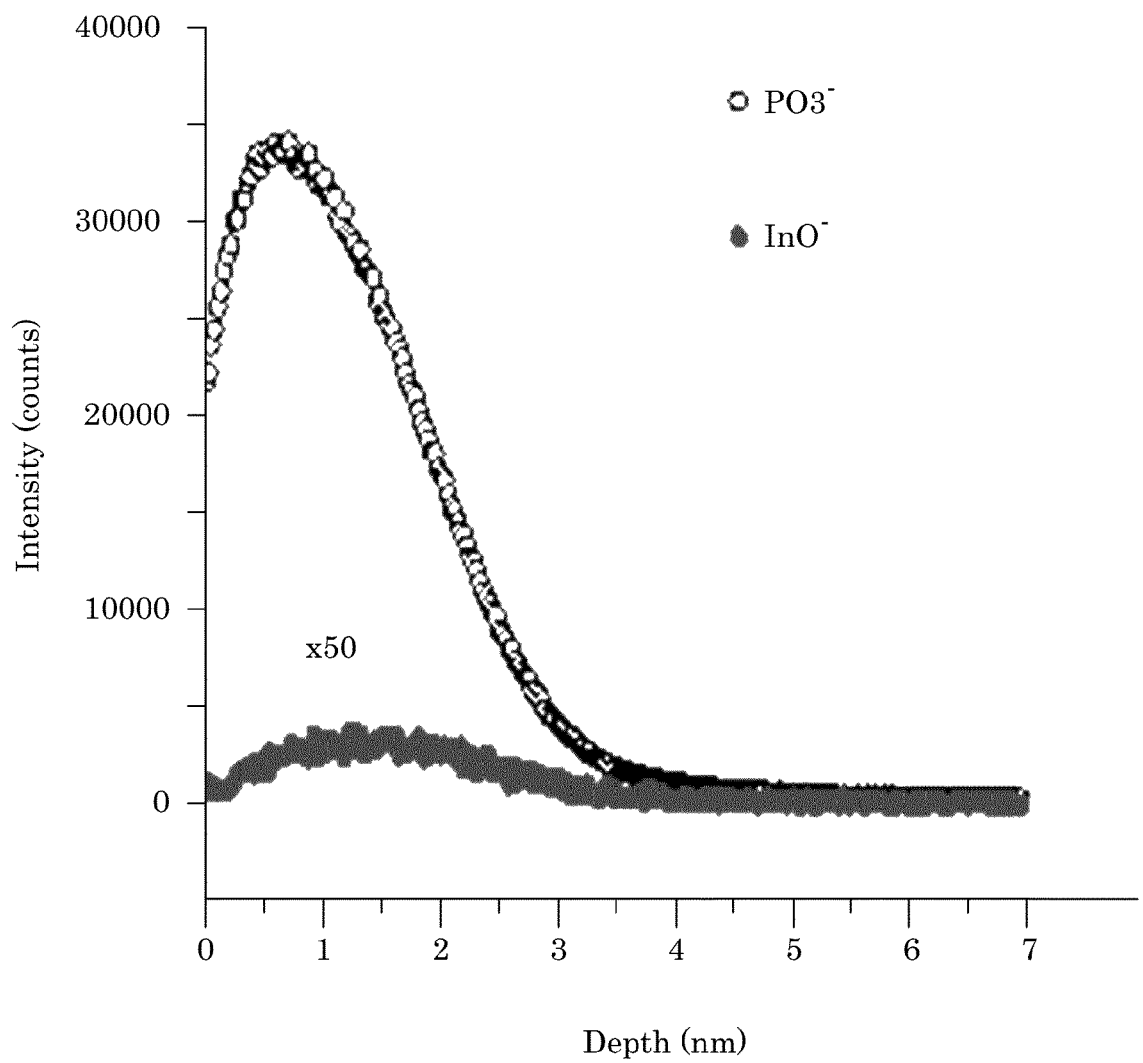
FIG. 27 shows a secondary ion mass spectrometry (SIMS) profile of the amorphous layer (shown in panels D and E of FIG. 26) from an area covered with very long nanochannels and shows a high concentration of oxidized phosphorous.
Figure 33:
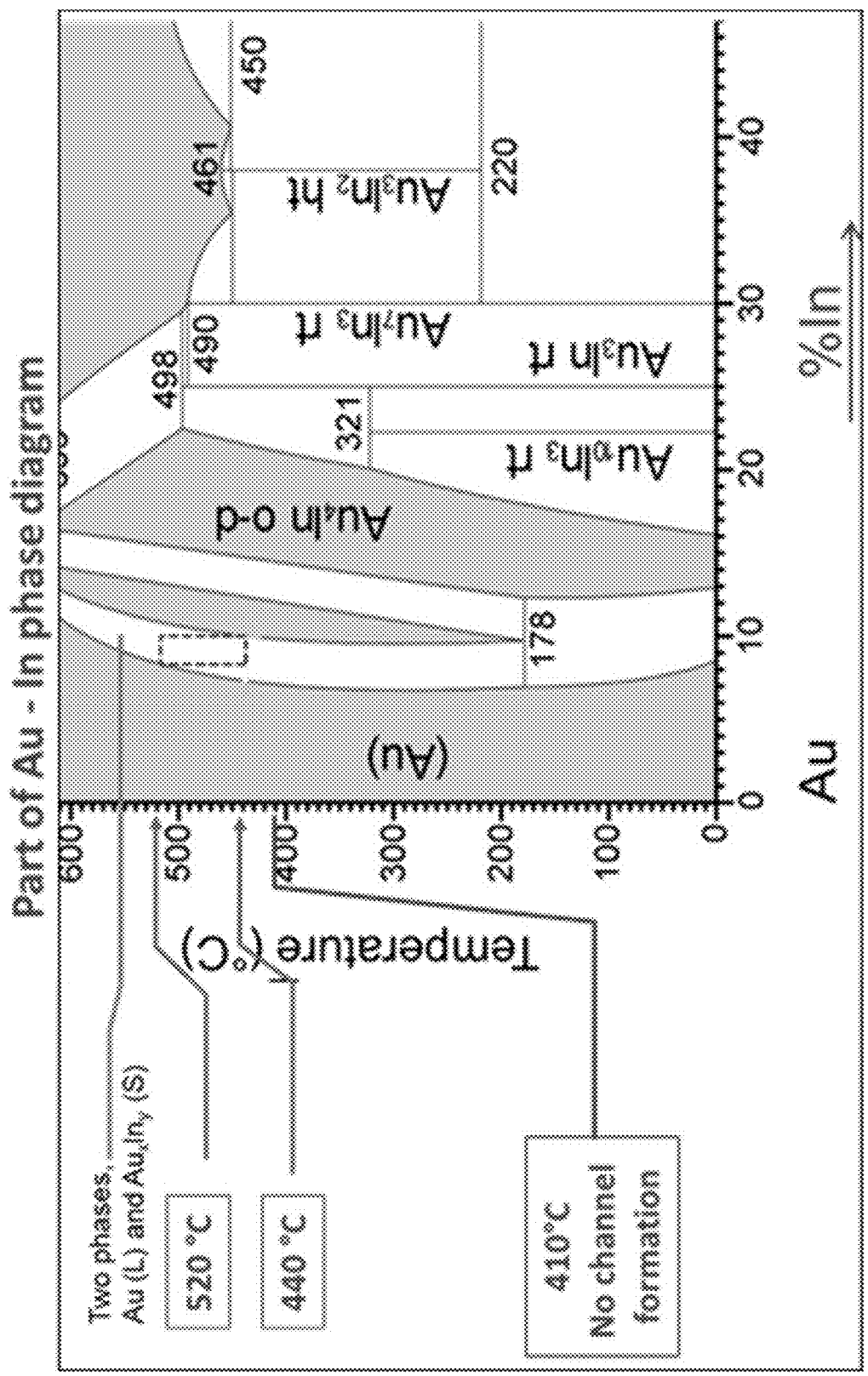
FIG. 33 shows a graph of temperature versus percentage indium in gold, wherein the dashed box indicates a temperature (from 440° C. to 520° C.) at which a two-phase region containing Au and solid $Au_xIn_y$ is present.

At 520° C., indium has a solubility of about 8 at. %-9 at. % in Au, which according to the In—Au phase diagram corresponds to a AuIn droplet that could be in solid or liquid form (see FIG. 33). Here, long nanochannels are formed within 15 minutes of reaction time, and a minimum temperature for channel formation is roughly 440° C. to form, at a minimum temperature, Au-rich liquid (450° C.) (see phase diagram, FIG. 33). High-angle-annular bright-field STEM of the cross-section of long nanochannels (and insets) in panel D of FIG. 26 show the nanochannels typically have 2 or 3 sides depending on the size of the bottom (100) plane, and, in some cases, an amorphous layer forms at the vicinity of nanochannels as shown in the lattice resolved image of panel E of FIG. 26. SIMS profiling at the location of long nanochannels shows that the amorphous layer is an oxidized layer containing considerably more phosphorus oxide than the indium oxide (FIG. 27). This could indicate a higher rate of loss of the oxidized indium species from the amorphized layer of InP. Since the substrate must be crystalline to allow formation of these highly oriented nanochannels, oxidation is a secondary effect and occurs after channels are formed in InP. By controlling the period that water vapor is introduced, oxidation of the formed nanochannels is avoided.

Figure 28:
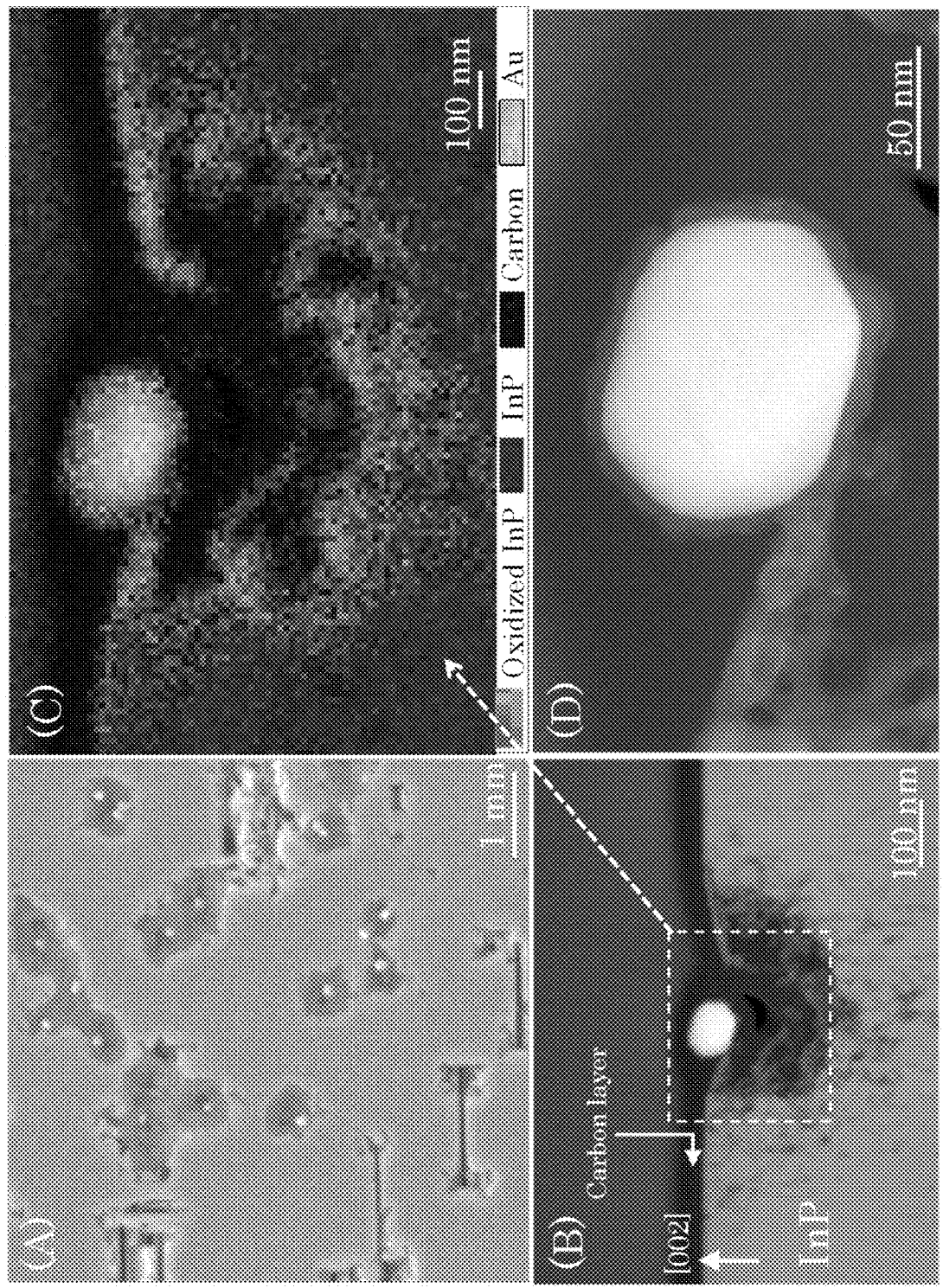
FIG. 28 shows, in panel A, a top view of Au nanoparticles with an average size of 100 nm disposed on InP (100) after reaction with water vapor, wherein irregularly shaped pits formed underneath the larger sized Au nanoparticles particles, and smaller Au nanoparticles that served as etchant catalysts provided anisotropic etching of the InP to form nanochannels; panel B shows an STEM-HAADF cross-sectional image of a Au nanoparticle on InP in which the dark area underneath the Au nanoparticle is the etched crystal that is filled with FIB-deposited carbon; panel C shows an elemental map of this region in which an InP oxide layer (cyan) surrounds the carbon-filled area (blue), wherein red indicates unaffected InP substrate, and the Au particle (yellow) is coated with a thin shell of oxidized InP; and panel D shows a faceted Au particle coated with an about 20 nm oxide layer.
Figure 34:
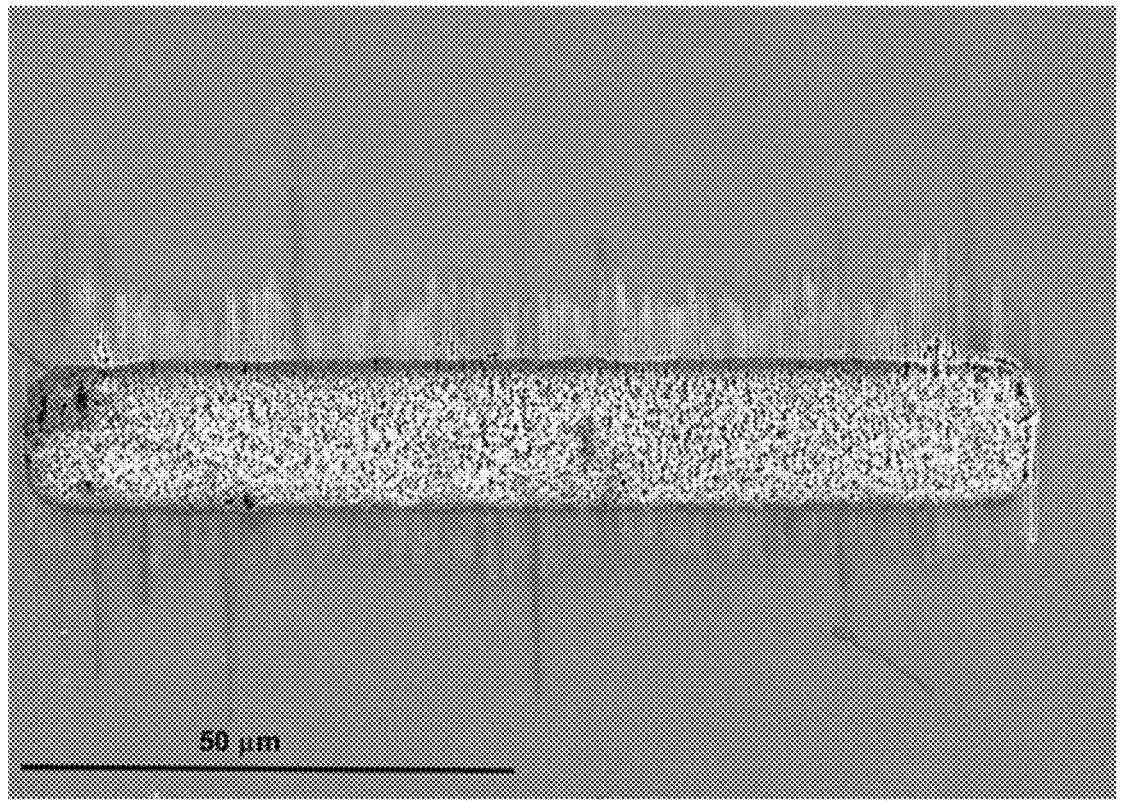
FIG. 34 shows an increase in Au film thickness provides formation of wider nanochannels that grow at a slower rate and that are shorter in length than nanochannels formed from a thinner Au film.

By increasing the Au film thickness or use of larger size colloidal Au nanoparticles, it is possible to increase the channel width; however, thick nanochannels systematically grow more slowly and are shorter than thin ones. An example is shown in panel G of FIG. 26 (see also FIG. 34) where nanochannels are formed from an about 7 nm thick Au film. For these larger-diameter nanochannels, the facets are more readily identified in the micrographs. As the Au droplet size increases above 100 nm or larger, the surface-directed etch process completely stops. This is further demonstrated in panel A of FIG. 28, where Au nanoparticles with an average size of about 100 nm dispersed on InP undergo the nanochannel etch condition shown in panel C of FIG. 22.

Figure 35:
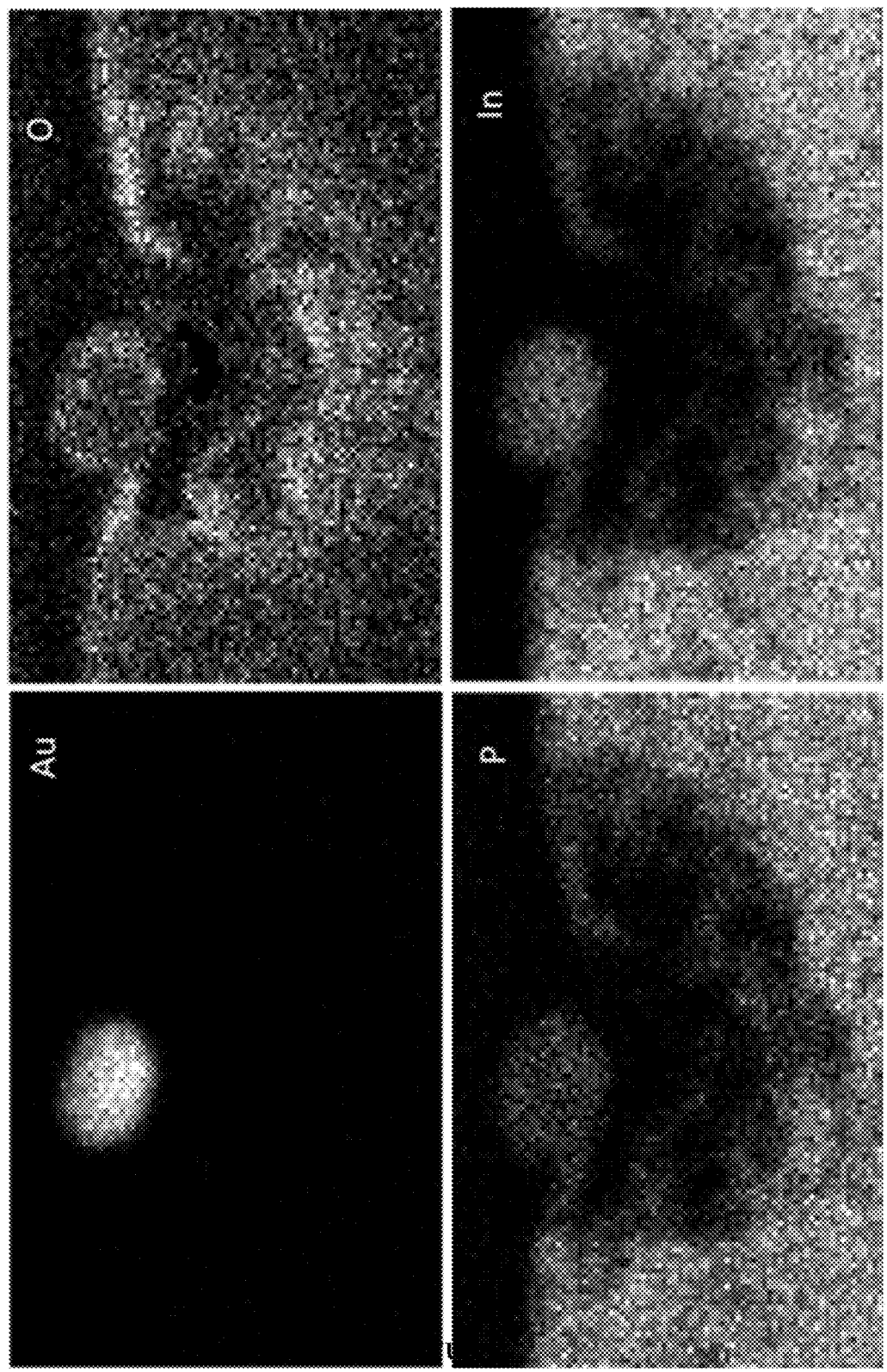
FIG. 35 shows elemental maps of Au, O, P, and In at an InP interface with a large size Au droplet, wherein In and P are present in the cooled Au droplet, and the elemental map for oxygen shows a thicker oxide accumulation at the Au particle interface with InP.

For larger particles of this size distribution, a non-faceted pit with an average diameter of about 400 nm forms underneath the Au particles indicating loss of the underlying InP. The etched cavity as well as the top surface of the Au particle were coated with an electron-deposited carbon layer (appears in dark gray) to protect the structure during ion milling and polishing. This area can be seen as the dark gray region in the STEM-HAADF cross-sectional image of panel B of FIG. 28. According to XEDS maps in panel C of FIG. 28 (gray scale maps for each element are shown in FIG. 35), there are two regions (colored in cyan) that contain oxidized InP, namely, the internal surface of the cavity and a thin shell surrounding the Au particle. The green area shows the deposited protective carbon, which was introduced during the cross-section preparation. The formation of an oxide layer at the InP interface with particles larger than 100 nm in size (panels C and D of FIG. 28) indicates that the oxide forms more rapidly than it can escape, resulting in accumulation at the Au/InP interface (FIG. 24). The oxide layer formed at the interface can block a VLS mechanism by preventing direct contact between metal and semiconductor.

In addition to particle size, the temperature at which water is introduced to the system is crucial to form direct contact between Au and InP in order to promote the VLS-based surface channel etch. If water is introduced prior to the heating and kept on continuously through the heating phase (condition of panel A of FIG. 22), the Au motion never occurs, even for well-separated Au nanoparticles smaller than 100 nm. Under this condition, it is likely that a process analogous to that proposed for larger particles takes place, namely, formation of an oxide layer at the Au/InP interface. Given the fact that the Au and InP alloying reactions starts at temperatures as low as 320° C., occurrence of oxide formation at the interface of the InP/Au droplet is highly probable during early introduction of water to the process. The oxide at the interface stops the necessary Au/InP interface for nanochannel formation.

Figure 29:
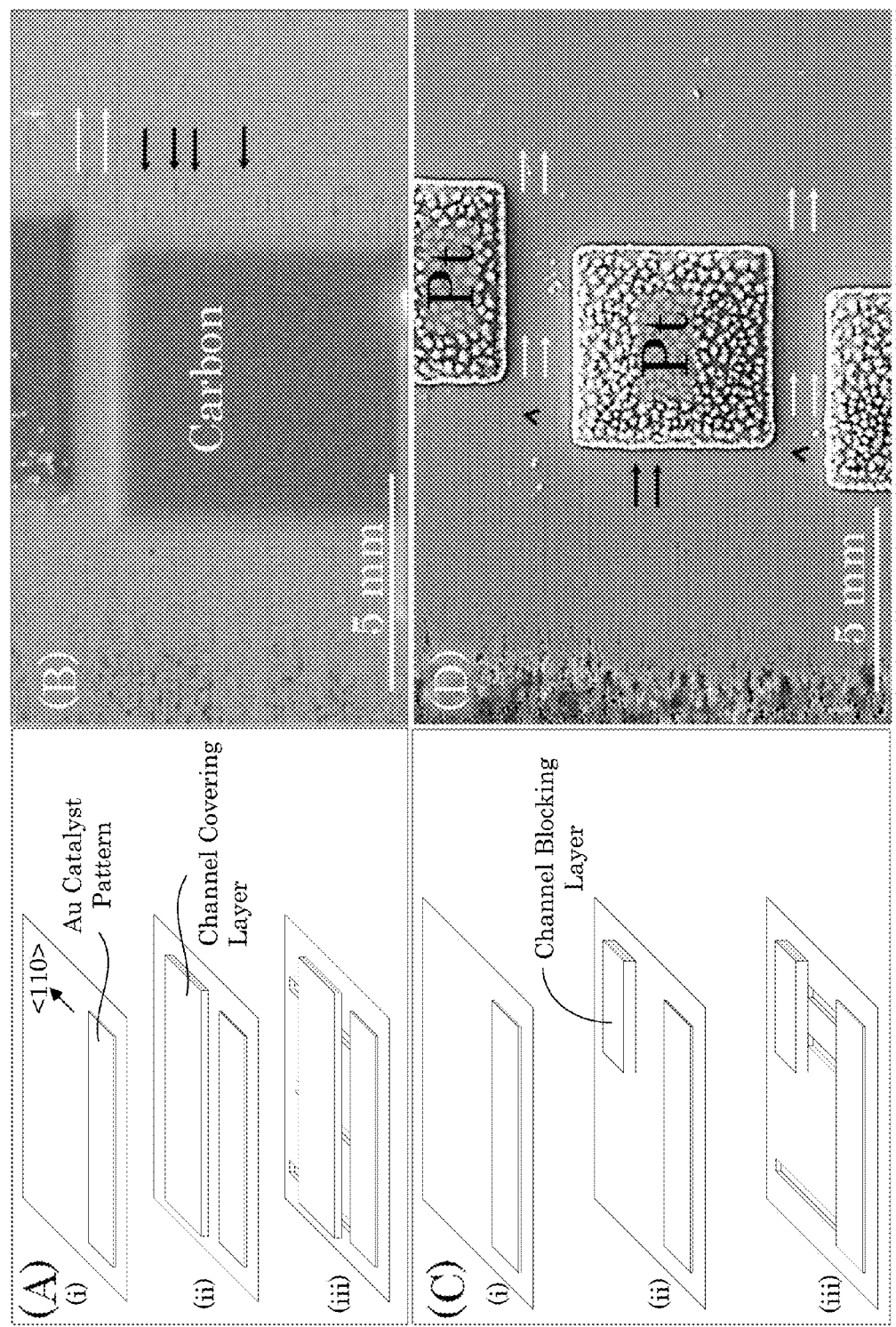
FIG. 29 shows formation of nanotunnels in panel A; panel B shows Au etchant catalyst disposed on a semiconductor substrate that provides formation of nanotunnels in a presence of 1 μm-thick FIB-deposited carbon layer; panel C shows blocking growth of nanochannels; and panel D shows 500 nm thick Pt layers terminated growth of nanochannels (indicated by red arrows)

For applications as hollow nanotunnels, as for nanofluidics, the nanotunnels are sealed at their top side. Nanotunnels were formed on designated areas of InP that are pre-coated with a protective top layer. A simple flow process is illustrated in panel A of FIG. 29, where, first, a pattern of Au catalyst is deposited (i) to define the starting point of the nanochannels. Then a channel cover layer is placed on the growth path of nanochannels (ii). Our results show that a cover layer consisting of electron-beam deposited carbon (≈1000 nm thick) placed on the path of nanochannels does not impede their growth (iii). Panel B of FIG. 29 shows passage of nanotunnels underneath the carbon layer, indicating that the water vapor diffusion could take place through the cover layer provided that it does not react or trap the water molecules. Nanotunnels can grower slower or shorter than nanochannels during the 15 minutes duration of the experiment. This approach also allows adjusting the channel length by fully quenching the etch process via either blocking the permeability of water through, e.g., using a blocking layer or poisoning the metal etchant catalyst at a specific position.

Flow of this process is schematically shown in panel C of FIG. 29, wherein a blocking layer is placed at the selected termination site of the nanochannels. An example is shown in panel D of FIG. 29, in which 500 nm-thick FIB-deposited Pt pads deposited prior to the growth of nanochannels block growth of a select group of nanochannels due to its alloying reaction with Au. The surface-directed VLS etch process is useful as a bottom-up nanofabrication process for large scale integration of nanoscale devices and means for nanoscale material delivery and processing.

In this Example, metal etchant catalyst assisted anisotropic etching of a semiconductor substrate provides formation of nanoducts. The Au etchant catalyst below a certain size alloys with the underlying semiconductor substrate and, in the presence of water vapor, locally catalyzes oxidation of the semiconductor substrate. The oxidized reaction products depart the alloyed catalyst droplet in forming the nanoduct (e.g., the nanochannel or the nanotunnel). Au etchant catalysts with very small sizes travel remarkable distances, forming directed (i.e., crystallographically aligned) nanoducts on the surface. The etch process was site specific and provided control over the direction of the nanochannels. Control over the dimensions of nanochannels as well as site specific coating or blockage of nanochannels provide scalable surface nanoengineering. The process for forming the nanoducts are useful in development of advanced materials as well as multifunctional heterogeneous nanosystems, including electro-optical and nanofluidics.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A process for making a nanoduct, the process comprising:
    disposing an etchant catalyst on a semiconductor substrate comprising a single crystal structure;
    heating the semiconductor substrate to an etching temperature;
    introducing an oxidant;
    contacting the semiconductor substrate with the oxidant in a presence of the etchant catalyst;
    anisotropically etching the semiconductor substrate by the etchant catalyst in a presence of the oxidant in an etch direction that is coincident along a crystallographic axis of the semiconductor substrate; and
    forming the nanoduct as the etchant catalyst propagates along a surface of the semiconductor substrate during anisotropically etching the semiconductor substrate, the nanoduct being crystallographically aligned with the crystallographic axis of the semiconductor substrate.

2. The process for making a nanoduct of claim 1, further comprising:
    forming a pattern of the etchant catalyst on the surface of the semiconductor substrate prior to introducing the oxidant.

3. The process for making a nanoduct of claim 2, further comprising:
    forming a plurality of droplets comprising the etchant catalyst in response to heating the semiconductor substrate.

4. The process for making a nanoduct of claim 1, further comprising:
    dissolving, by the etchant catalyst, a portion of the semiconductor substrate in contact with the etchant catalyst during anisotropically etching the semiconductor substrate.

5. The process for making a nanoduct of claim 2, further comprising:
    converting the portion of the semiconductor substrate to a volatile oxide during anisotropically etching the semiconductor substrate.

6. The process for making a nanoduct of claim 5, converting the portion of the semiconductor substrate to the volatile oxides comprises:
    reacting the portion of the semiconductor substrate with oxidant to form the volatile oxide.

7. The process for making a nanoduct of claim 1, further comprising:
    disposing a covering layer on the semiconductor substrate to form a covered portion of the semiconductor substrate.

8. The process for making a nanoduct of claim 7, further comprising:
    anisotropically etching the covered portion of the semiconductor substrate by the etchant catalyst in presence of the oxidant in the etch direction that is coincident along the crystallographic axis of the semiconductor substrate; and
    forming the nanoduct comprising a nanotunnel in the covered portion of the semiconductor substrate in response to anisotropically etching the covered portion.

9. The process for making a nanoduct of claim 1, further comprising:
    disposing a blocking layer on the semiconductor substrate to form a blocking portion of the semiconductor substrate.

10. The process for making a nanoduct of claim 9, further comprising:
    terminating the anisotropically etching of the semiconductor substrate at the blocking portion.

11. The process for making a nanoduct of claim 1, wherein:
    the etchant catalyst comprises gold, silver, gallium arsenide, or a combination comprising at least one of the foregoing etchant catalysts.

12. The process for making a nanoduct of claim 1, wherein:
    the semiconductor substrate comprises arsenic, gallium, germanium, indium, phosphorous, silicon, or a combination comprising at least one of the foregoing semiconductor substrates.

13. The process for making a nanoduct of claim 12, wherein:
    the semiconductor substrate comprises gallium arsenide, indium arsenide, indium phosphide, silicon, or a combination comprising at least one of the foregoing semiconductor substrates.

14. The process for making a nanoduct of claim 1, wherein:
    the nanoduct comprises a nanochannel, a nanotunnel, or a combination comprising at least one of the foregoing nanoducts.

15. The process for making a nanoduct of claim 14, wherein:
    the nanoduct further comprises a nanofrustocone.

16. The process for making a nanoduct of claim 15, wherein:
    the nanofrustocone comprises a convergent nanofrustocone.

17. The process for making a nanoduct of claim 15, wherein:
    the nanofrustocone comprises a divergent nanofrustocone.

18. The process for making a nanoduct of claim 14, wherein:

the nanoduct comprises the nanochannel, and the nanochannel comprises a truncated nanofrustocone.

19. The process for making a nanoduct of claim 18, wherein:
the truncated nanofrustocone comprises a convergent truncated nanofrustocone.

20. The process for making a nanoduct of claim 18, wherein:
the truncated nanofrustocone comprises a divergent truncated nanofrustocone.

* * * * *